(12) United States Patent
Nasu et al.

(10) Patent No.: US 6,667,997 B2
(45) Date of Patent: Dec. 23, 2003

(54) OPTICAL MODULE AND METHOD OF MAKING THE SAME

(75) Inventors: Hideyuki Nasu, Chiyoda-ku (JP); Takehiko Nomura, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 113 days.

(21) Appl. No.: 10/032,612

(22) Filed: Jan. 2, 2002

(65) Prior Publication Data

US 2002/0126717 A1 Sep. 12, 2002

(30) Foreign Application Priority Data

Mar. 9, 2001 (JP) ........................................ 2001-067894
Sep. 4, 2001 (JP) ........................................ 2001-268120

(51) Int. Cl.$^7$ ............................................ H01S 5/0687
(52) U.S. Cl. ...................................................... 372/32
(58) Field of Search ...................................... 372/32, 36

(56) References Cited

U.S. PATENT DOCUMENTS

| | | | |
|---|---|---|---|
| 4,998,256 A | 3/1991 | Ohshima et al. | 372/32 |
| 5,848,211 A | * 12/1998 | Yang et al. | 385/93 |
| 6,243,403 B1 | * 6/2001 | Broutin et al. | 372/32 |
| 6,291,813 B1 | 9/2001 | Ackerman et al. | 250/214 R |
| 6,400,739 B1 | * 6/2002 | Auracher | 372/32 |
| 6,560,252 B1 | * 5/2003 | Colbourne et al. | 372/32 |

FOREIGN PATENT DOCUMENTS

JP 2000-056185 2/2000

OTHER PUBLICATIONS

Villeneuve et al., "High–stability wavelength–controlled DFB–laser sources for dense WDM applications," Optical Fiber Communication (OFC) conference Technical Digest, Mar. 20, 2001.

Tatsuno et al., "50GHz spacing, multi–wavelength tunable locker integrated in a transmitter module with a monolithic–modulator and a DFB–laser," OFC Technical Digest TuB5–1, Mar. 20, 2001.

Adams et al., "Module–packaged tubable laser and wavelength locker delivering 40mW of fibre–coupled power on 34 channels," Electronics Letters vol. 37, No. 11, 691–692, May 24$^{th}$, 2001.

* cited by examiner

*Primary Examiner*—James Davie
(74) *Attorney, Agent, or Firm*—Oblon, Spivak, McClelland, Maier & Neustadt, P.C.

(57) ABSTRACT

An optical module has a hermetically sealed package, a semiconductor laser element located within the package for outputting a laser beam, an optical fiber for receiving and externally delivering the laser beam outputted from the front end face of the semiconductor laser element, a prism for receiving a monitoring laser beam outputted from the back end face of the semiconductor laser element and for dividing the received laser beam into two laser beam components which are inclined relative to the optical axis with predetermined angles less than 90 degrees, a first photodiode for receiving one of the laser beam components divided by the prism, a second photodiode for receiving the other laser beam component from the prism, an optical filter disposed between the first photodiode and the prism and adapted to permit only a laser beam having a predetermined wavelength range to pass therethrough, and a PD carrier in which the first and second photodiodes are mounted on the same mount surface.

32 Claims, 20 Drawing Sheets

OPTICAL MODULE AND METHOD OF MAKING THE SAME

BACKGROUND OF THE INVENTION

1. Field of the Invention

The present invention relates to an optical module used in a transmitter for transmitting optical signals, such as a semiconductor laser module or the like, and a method of making the same. The present invention particularly relates to an optical module suitable for use in a light-signal transmission in a wavelength division multiplexing (WDM) communication system and a method of making the same.

2. Discussion of the Background

Generally, the field of dense WDM requires optical transmitters to produce light-signals at stable wavelengths for a long time. To accomplish this, it has been developed an optical module that includes a wavelength monitor located in the package thereof. One of the prior art optical modules including the wavelength monitor is disclosed, for example, in Japanese Patent Laid-Open Application No. Hei 12-56185.

Referring first to FIG. 20, there is shown an optical module constructed according to the prior art and having a wavelength monitor. The optical module includes a laser diode 50 for outputting a laser beam with a predetermined wavelength; an optical fiber 51 optically coupled with the laser diode 50 and adapted to externally deliver the laser beam outputted from the laser diode 50 at its front end face (right side as viewed in FIG. 20); an optical filter 52 having its cutoff wavelength substantially equal to the lasing wavelength of the laser diode 50; a beam splitter 53 including a half mirror for dividing a monitoring laser beam outputted from the laser diode 50 at its back end face (left side as viewed in FIG. 20) into two laser beam components; a first photodiode for receiving one of the two laser beam components divided by the beam splitter 53 after it has passed through the optical filter; a second photodiode 55 for receiving the other laser beam component from the beam splitter 53; a Peltier module 56 for regulating the temperature in the laser diode 50; and a control unit 57 for controlling the Peltier module 50 to control the wavelength in the laser diode 50, based on PD currents outputted from the first and second photodiodes 54, 55.

Between the laser diode 50 and the optical fiber 51 is disposed a condensing lens 58 for coupling the laser beam from the front end face of the laser diode 50 with the optical fiber 51. Between the laser diode 50 and the beam splitter 53 is also disposed a collimating lens 59 for collimating the laser beam outputted from the back end face of the laser diode 50.

The laser diode 50, condensing lens 58 and collimating lens 59 are fixedly mounted on an LD carrier 60. The first and second photodiodes 54, 55 are fixedly mounted on first and second PD carriers 61, 62, respectively.

The beam splitter 53, optical filter 52 and first and second PD carriers 62 are fixedly mounted on a metallic base plate 63 that is fixedly mounted on the surface of the LD carrier 60. The LD carrier 60 is fixedly mounted on the Peltier module 56.

The laser diode 50, beam splitter 53, optical filter 52, condensing lens 58, collimating lens 59, LD carrier 60, first PD carrier 61, second PD carrier 62, metallic base plate 63 and Peltier module 56 are housed within a package 64. The tip end of the optical fiber 51 is held by a ferrule 65 that is fixedly mounted on the side of the package 64 through a sleeve 66.

The laser beam outputted from the front end face of the laser diode 50 is condensed by the condensing lens 58 and then enters the optical fiber 51 held by the ferrule 65 before it is externally delivered therefrom.

On the other hand, the laser beam outputted from the back end face of the laser diode 50 is collimated by the collimating lens 59 and then enters the beam splitter 53 wherein the laser beam is divided into two laser beam components, directed to a Z-axis direction (or direction of transmission) and an X-axis direction, (or direction of reflection) perpendicular to the Z-axis direction. The laser beam component directed to the Z-axis direction is subjected to wavelength filtering by the optical filter 52, and is then received by the first photodiode 54 while the laser beam component directed to the X-axis direction is received by the second photodiode 55. PD currents outputted from the first and second photodiodes 54, 55 enter the control unit 57 that, based on the received PD currents, controls the temperature in the Peltier module 56 to control the wavelength in the laser diode 50.

In the conventional optical module that contains the wavelength monitor, the first and second photodiodes 54, 55 are for respectively receiving the divided laser beam components and cannot be arranged in the same plane since the laser beam is divided by the half-mirror type beam splitter 53 into such two laser beam components directed to the Z-axis direction and X-axis direction perpendicular to the Z-axis direction. Thus, the prior art device, as recognized by the present inventor, must use two separate PD carriers 61 and 62 for fixedly supporting the first and second photodiodes 54, 55. As a result, the number of parts increases to raise the manufacturing cost.

The half-mirror type beam splitter 53 has a wavelength dependency since the laser beam is divided into two laser beam components, one reflected by the mirror and one transmitted the mirror. The dense WDM particularly requires high-precision wavelength control of laser beam. As recognized by the present inventors, the wavelength dependency on the laser beam components divided by the half mirror may lead to error in the wavelength control.

Each of the two PD carriers 61 and 62 must independently be subjected to optical aligning. As a result, the number of manufacturing steps increases to prolong the manufacturing time.

Moreover, the wavelength characteristic of the optical filter 52 is variable depending on the angle of incident light. Notwithstanding, the prior art device fixedly mounts the optical filter 52 on the metallic base plate 63 and incorporates the metallic base plate 63 into the optical module before the wavelength monitor unit is completed in assembly. In such a procedure, the set angle of incident light relative to the optical filter 52 can not be changed after the wavelength monitor unit has been incorporated into the optical module. This is disadvantageous in that any desired wavelength characteristic of the optical filter 52 cannot be provided due to failures in the position and angle of the wavelength monitor unit in the optical filter or depending on the position and angle of the wavelength monitor unit when it has been incorporated into the optical filter. This reduces yields for optical module.

In addition, the conventional optical module is not readily scalable. The lack of scalability is due to an increase in the parts needed to ensure a reproducible and obstruction-free optical paths from the laser diode to the respective photodiodes.

SUMMARY OF THE INVENTION

One aspect of the present invention is to address the above-identified and other deficiencies and limitations associated with conventional optical module devices and optical transmission methods.

In contrast to the prior art, the present invention provides an optical module that can be produced with reduced manufacturing cost and time and that can be reduced in size with its improved wavelength stability for the laser beam, and a method of making such an optical module.

The present invention also provides an optical module that can be adjusted relating to its angle of incident light relative to the optical filter to provide a predetermined wavelength characteristic for improving yields, after assembled, and a method of making such an optical module.

The present invention provides an optical module that includes

- a light-emitting device for outputting a laser beam;
- an optical fiber for receiving and externally delivering the laser beam outputted from the light-emitting device at one facet;
- a beam splitter for dividing a monitoring laser beam outputted from the light-emitting device at the other facet into two laser beam components, the two laser beam components being inclined relative to the optical axis within a predetermined angle less than 90 degrees;
- a first photo detector for receiving one of the two laser beam components divided by the beam splitter;
- a second photo detector for receiving the other laser beam components;
- an optical filter disposed between either of the first or second photo detector and the beam splitter and for permitting only a laser beam having a predetermined wavelength range to transmit therethrough; and
- a mount member on that both the first and second photo detectors are mounted.

The present invention further provides a method of making an optical module, including the steps of:

(1) fixing a light-emitting device for outputting a laser beam;

(2) fixing a beam splitter for dividing a monitoring laser beam outputted from the light-emitting device at the other facet into two laser beam components, said two laser beam components being inclined relative to the optical axis within a predetermined angle less than 90 degrees;

(3) fixing on a mount member a first photo detector for receiving one of the two laser beam components divided by the beam splitter and a second photo detector for receiving the other laser beam components;

(4) fixing an optical filter disposed between either of the first or second photo detector and the beam splitter and for permitting only a laser beam having a predetermined wavelength range to transmit therethrough; and (5) fixing an optical fiber for receiving and externally delivering the laser beam outputted from the light-emitting device at one facet.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 7 is a side view of the optical filter shown in FIG. 6, in which FIG. 7A shows the optical filter rotatably supported on a base and FIG. 7B shows the optical filter fixedly mounted on the base;

FIG. 9A is a plane view showing the holder member of FIG. 8 before it is fixedly mounted on the base while FIG. 9B is a plan view showing the same holder member after it has fixedly been mounted on the base;

FIG. 11A is a plan view illustrating the structure and function of a prism used in an optical module according to the fifth embodiment of the present invention while FIG. 11B is a perspective view of the prism;

DESCRIPTION OF THE INVENTION

Several embodiments of the present invention will now be described with reference to the drawings.

Figure 1:
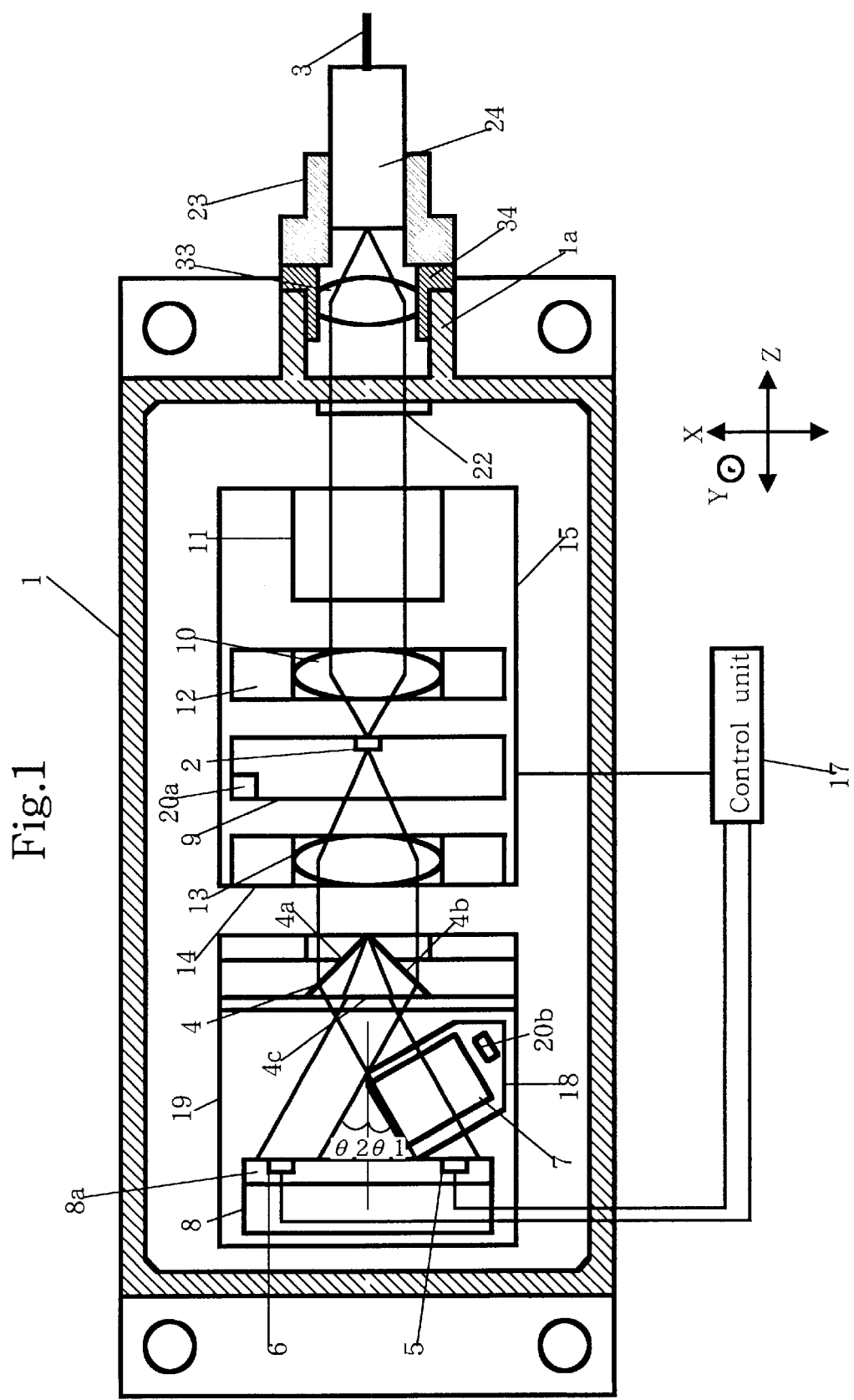
FIG. 1 is a plan cross-sectional view of an optical module constructed according to a first embodiment of the present invention.
Figure 2:
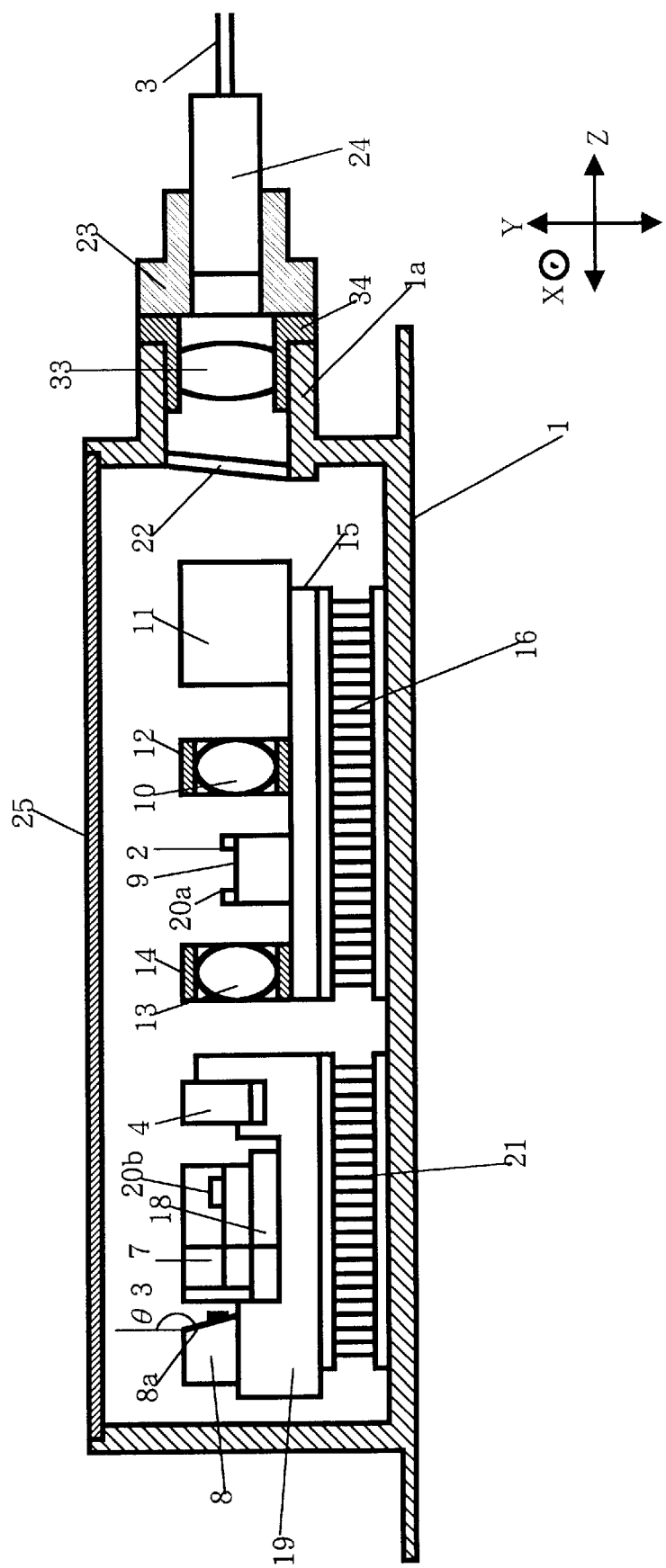
FIG. 2 is a side cross-sectional view of the optical module shown in FIG. 1.
Figure 3:
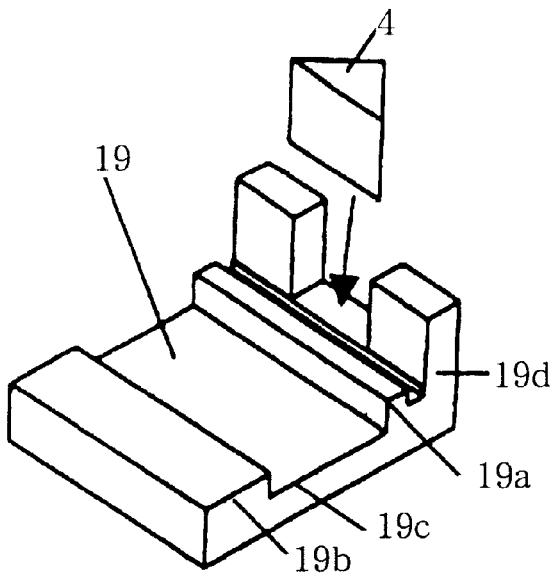
FIGS. 3A–C are perspective views illustrating a procedure of assembling a prism, optical filter and PD carrier used in the optical module shown in FIGS. 1 and 2.
Figure 3:
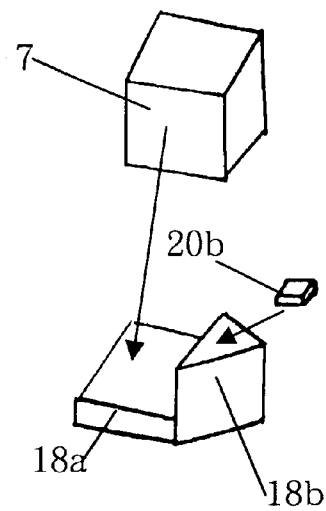
Figure 3:
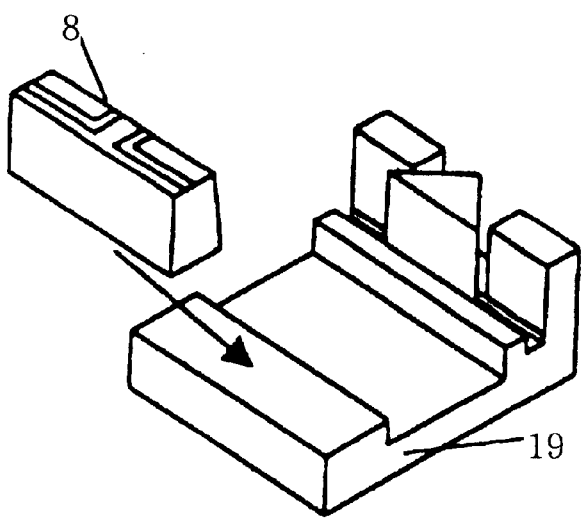
Figure 4:
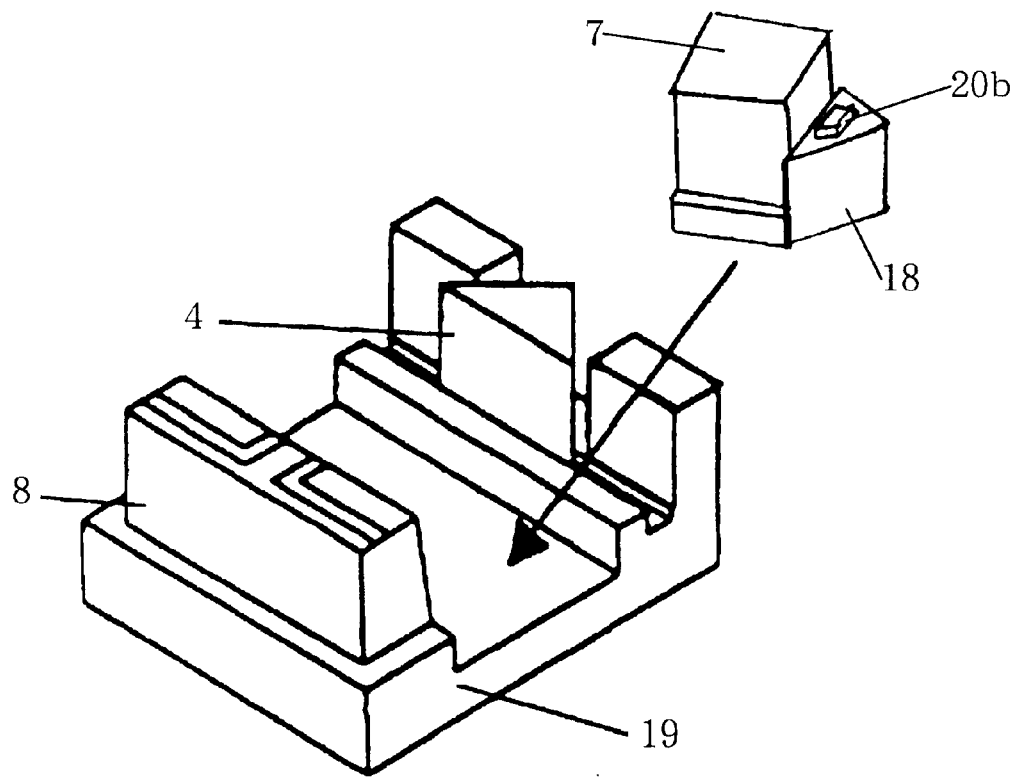
FIGS. 4A–C are perspective views illustrating another procedure of assembling the prism, optical filter and PD carrier used in the optical module shown in FIGS. 1 and 2.
Figure 4:
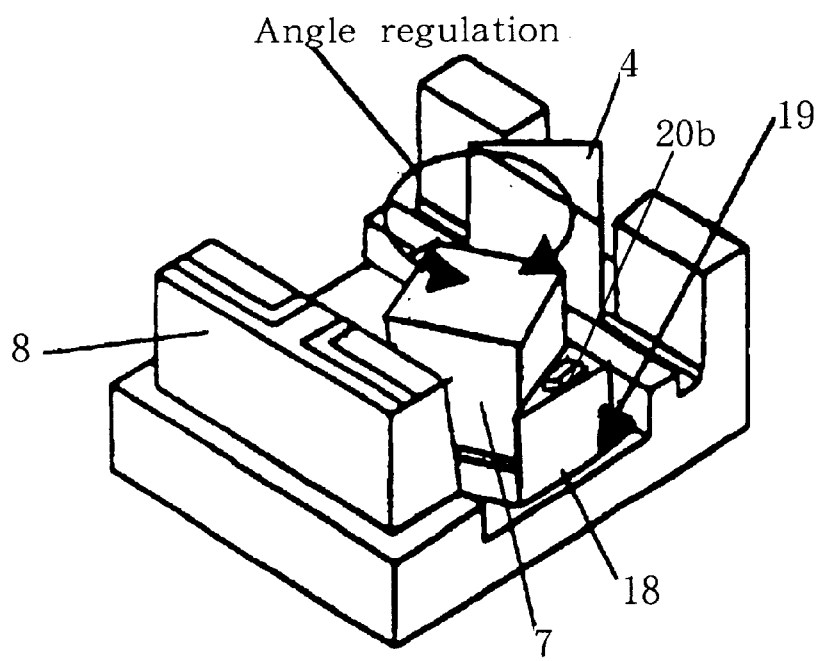

FIG. 1 is a plan cross-sectional view of an optical module constructed according to the first embodiment of the present invention; FIG. 2 is a side cross-sectional view of the optical module shown in FIG. 1; and FIGS. 3 and 4 are perspective views illustrating a procedure of assembling a prism, optical filter and PD carrier which are used in the optical module according to the first embodiment of the present invention.

Referring now to FIGS. 1 and 2, the optical module includes a hermetically sealed package 1; a semiconductor laser element (or light-emitting device) 2 located within the package 1 and for outputting a laser beam; an optical fiber 3 for receiving and externally delivering a laser beam outputted from the semiconductor laser element 2 at its front end face (right side as viewed in FIG. 1); a prism (or beam splitter) 4 for dividing a monitoring laser beam outputted from the semiconductor laser element 2 at its back end face (left side as viewed in FIG. 1) into two laser beam components that are inclined relative to the optical axis with the respectively predetermined angles θ1 and θ2, each of which is less than 90 degrees; a first photodiode (or photo detector) 5 for receiving one of the laser beam components divided by the prism 4; a second photodiode (or photo detector) 6 for receiving the other laser beam component from the prism 4; an optical filter 7 disposed between the first photodiode 5 and the prism 4 and for permitting only a laser beam having a predetermined wavelength range to transmit therethrough; and a PD carrier (or mount member) 8 on which the first and second photodiodes 5, 6 are mounted in the same plane (which will be referred to the same mounting plane 8a).

The semiconductor laser element 2 is fixedly mounted on an LD carrier 9 on which a thermistor 20a for sensing the temperature in the semiconductor laser element 2 is located.

Between the semiconductor laser element 2 and the optical fiber 3 are disposed a collimating lens (or first lens) 10 for collimating the laser beam outputted from the front end face of the semiconductor laser element 2 and an optical isolator 11 for blocking any light reflected back by the optical fiber 3. The collimating lens 10 is held by a first lens holder 12.

Between the semiconductor laser element 2 and the prism 4 is disposed another collimating lens 13 for collimating the monitoring laser beam outputted from the back end face of the semiconductor laser element 2. The collimating lens 13 is held by a second lens holder 14.

The LD carrier 9, optical isolator 11, first lens holder 12 and second lens holder 14 are fixedly mounted on a first base 15 that is in turn fixedly mounted on a first cooling device 16 including a Peltier module for cooling the semiconductor laser element 2 (see FIG. 2).

PD currents outputted from the first and second photodiodes 5, 6 are received by a control unit 17 that, based on the received PD currents, controls the temperature in the first cooling device 16 to control the wavelength of the laser beam outputted from the semiconductor laser element 2.

The prism 4 includes two sloped light entering faces 4a, 4b formed into an inverted V-shaped configuration and a flat light exiting face 4c. The laser beam outputted from the semiconductor laser element 2 is divided by the prism 4 into two laser beam components as the laser beam enters both the two sloped faces 4a and 4b of the prism 4.

The whole surface of the prism 4 is coated with an AR (anti-reflection) film for suppressing the reflection of laser beam in the prism 4. The inclined angles θ1 and θ2 of the laser beam components divided by the prism 4 are preferably substantially equal to each other (e.g., within a range between 15 and 45 degrees). This is because the light receiving positions of the first and second photodiodes 5, 6 will more easily be determined by use of such inclined angles.

The optical filter 7 may be made of etalon or the like and is fixedly mounted on a filter holder 18 of substantially L-shaped cross-section at its bottom and side plates 18a, 18b through low temperature glass (i.e., glass with a low melting point) or solder (see FIG. 3B). The optical filter 7 can be moved by the filter holder 18 to regulate the angle of incident laser beam. The bottom or side plate 18a or 18b may support a temperature sensor such as a thermistor 20b. The thermistor 20b can accurately measure the temperature in the optical filter 7 since the bottom or side plate 18a or 18b is fixedly mounted on the optical filter 7 through a good heat conducting bonding agent such as low temperature glass or solder and is positioned intimately close to the optical filter 7.

The mounting surface 8a of the PD carrier 8 on which the first and second photodiodes 5, 6 are mounted is inclined relative to the direction of incident laser beam with an angle θ3 exceeding 90 degrees (see FIG. 2). The inclined angle θ3 of the mounting surface 8a is preferably equal to or larger than 95 degrees for reducing the reflected-back light and for providing an improved characteristic. If the mounting surface 8a is inclined relative to the direction of incident laser beam with an angle larger than the aforementioned range of angle, PD currents capable of coupled with the photodiodes will not sufficiently be obtained. It is thus preferred that the inclined angle θ3 is at least smaller than 135 degrees for suppressing the degradation in the coupling efficiency within 3 dB. It is thus preferred that the inclined angle θ3 in the mounting surface 8a is larger than 95 degrees but smaller than 135 degrees.

The prism 4, filter holder 18 and PD carrier 8 are fixedly mounted on a second base 19. As shown in FIGS. 3 and 4, the prism 4 is mounted in abutment with the wall of a first protrusion 19a formed on the second base 19 while the PD carrier 8 is mounted on a second protrusion 19b formed on the second base 19. The filter holder 18 is mounted in a recess 19c formed on the second base 19 between the first and second protrusions 19a, 19b.

The thermistor 20b for sensing the temperature in the optical filter 7 may fixedly be mounted on protrusions 19d that are formed on the second base 19 at its opposite sides.

As shown in FIG. 2, the second base 19 is fixedly mounted on a second cooling device 21 that includes a Peltier module. The second cooling device 21 is controlled to maintain the temperature sensed by the thermistor 20b (20) constant. A separate control unit may be used for performing the control operation, or control unit 17 may be used.

The package 1 includes a flange portion 1a formed therein on one end. The flange portion 1a houses a window 22 on which the light passed through the optical isolator 11 is incident and a condensing lens (or second lens) 33 for condensing the laser beam onto the end face of the optical fiber 3. The condensing lens 33 is held by a third lens holder 34 that is fixedly mounted on the outer end of the flange portion 1a through YAG laser welding. A metallic slide ring 23 is fixedly mounted on the outer end of the third lens holder 34 through YAG laser welding.

The ferrule 24 holding the tip end of the optical fiber 3 is fixed in the interior of the slide ring 23 through YAG laser welding at a predetermined position.

The top of the package 1 is closed by a lid 25 (see FIG. 2), the outer periphery of which is resistant-welded to the package 1 to hermetically seal it.

The laser beam outputted from the front end face of the semiconductor laser element 2 is collimated by the collimating lens 10 and then enters the condensing lens 33 through the optical isolator 11 and window 22. After condensed by the condensing lens 33, the laser beam is received and externally delivered by the optical fiber 3 held by a ferrule 24.

On the other hand, the monitoring laser beam outputted from the back end face of the semiconductor laser element 2 is collimated by the collimating lens 13 and divided by the prism 4 into two laser beam components having their inclined angles θ1 and θ2 relative to the optical axis.

One of the laser beam components divided by the prism 4 is received by the optical filter 7 through which only a laser beam having a predetermined wavelength range transmits. The transmitted light is received by the first photodiode 5. The other laser beam component is received by the second photodiode 6. PD currents outputted from the first and second photodiodes 5, 6 is received by the control unit 7 that, based on a differential voltage (or voltage ratio) between the two received PD currents, controls the temperature sensed by the thermistor 20a of the first cooling device 16 to maintain the wavelength of the beam outputted from the semiconductor laser element 2 constant.

The prism 4, optical filter 7, first photodiode 5, second photodiode 6 and PD carrier 8 for fixedly supporting them forms a wavelength monitor unit for monitoring the wavelength of the laser beam, together with the collimating lens 13 and second base 19, if necessary.

A process of making the optical module according to the first embodiment of the present invention will be described below.

First of all, the LD carrier on which the semiconductor laser element 2 is mounted, the optical isolator 11, the first lens holder 12 and the second lens holder 14 are fixedly mounted on the first base 15 through soldering.

Thereafter, the first base 15 is soldered onto the first cooling device 16 that has already been mounted in the package 1. Similarly, the second base 19 having no matter mounted on the top thereof is fixedly mounted on the second cooling device 21 that has already been mounted in the package 1.

Next, the prism 4 is properly positioned relative to the X-axis direction such that the monitoring laser beam outputted from the back end face of the semiconductor laser element 2 will enter the two sloped faces 4a and 4c of the prism 4. Subsequently, the prism 4 is brought into abutment with the first protrusion 19a of the second base 19 and fixedly positioned thereat through low temperature glass or solder (see FIG. 3A).

Next, the PD carrier 8 is positioned and fixedly soldered on the second protrusion 19b of the second base 19 such that the laser beam components divided by the prism 4 will enter both the first and second photodiodes 5, 6 (see FIG. 3C). The thermistor 20b is then fixedly soldered onto the bottom or side plate 18a or 18b in the filter holder 18.

Next, the optical filter 7 fixedly mounted on the filter holder 18 (see FIG. 3B) is placed (or roughly set) in the recess 19c of the second base 19 between the prism 4 and the first photodiode 5 (see FIG. 4A).

Next, the wavelength characteristic is measured based on the PD current from the first photodiode 5 produced in response to receiving the light passed through the optical filter 7 while moving the optical filter 7 to change the angle of incident laser beam (see FIG. 4B).

Next, the optical filter 7 is fixedly mounted on the second base 19 at such a position that is judged to provide the desired wavelength characteristic from the measurements, through YAG laser welding. This position is referred to as the wavelength locking point.

Next, the position of the optical fiber 3 is regulated relative to X-, Y- and Z-axes such that the output of the laser beam from the front end face of the semiconductor laser element 2 will be maximized. The ferrule 24 holding the tip end of the optical fiber 3 is fixed in the interior of the slide ring 23 through YAG laser welding at a position. Thereafter, the slide ring 23 is fixedly mounted on the end face of the flange portion 1a formed on the package 1 on one side through YAG laser welding.

Finally, the opened top of the package 1 is closed by the lid 25, the outer periphery of which is YAG laser welded to the package 1 to hermetically seal it.

According to the first embodiment of the present invention, the first and second photodiodes 5, 6 for receiving the laser beam components divided by the prism 4 are mounted on the single PD carrier 8 in the same mounting surface 8a. Thus, the number of parts can be reduced to lower the manufacturing cost. Since the two photodiodes 5 and 6 can optically be aligned with only a single PD carrier 8, the number of manufacturing steps can be reduced to shorten the manufacturing time.

Since the laser beam from the semiconductor laser element 2 is optically coupled with the prism 4 through the collimating lens 13 and divided by the prism 4 into two laser beam components received by the two photodiodes 5 and 6 on the single PD carrier 8, the optical paths can be reduced in length, thus making the necessary space compact. Thus, the optical module can be reduced in size with an improved coupling efficiency on conducting the monitoring laser beam to the photodiodes 5 and 6.

Since the position of the optical filter 7 is regulated relating to its angle in the final step, after the other components in the wavelength monitor unit have been incorporated into the optical module, and since the wavelength characteristic of the optical filter 7 is regulated while viewing the PD outputs, the optical module including its wavelength monitor is improved in wavelength regulation accuracy and can be produced with yield improvement.

Since the incident beam is divided by the roof prism 4, and since the division at the prism 4 can be carried out even though the angle of incident beam onto the prism 4 is smaller than 90° relative to the optical axis of the incident light, the loss for the polarization dependency can be reduced. This will be described in more detail in connection with FIG. 11. Since the prism 4 is not a large-sized optical part such as a dividing coupler, the optical module including the wavelength monitor according to the present invention can be reduced in size. When the roof prism 4 is used in such a manner, the angle of light to be divided can be regulated depending on the angle between the two sloped face of the roof prism. Therefore, the size of the optical module can further be reduced.

Since the laser beam entered two or more faces in the prism 4 is divided into beams transmitted through the prism 4, the wavelength dependency between the divided laser beam components can be reduced. Particularly, where the laser beam is divided into laser beam components having the same inclined angle relative to the optical axis in the incident light, the same wavelength dependency is provided between the divided laser beam components. In the arrangement of this embodiment in which the divided laser beam components are compared with each other, the wavelength dependency of the laser beam created from the division can be canceled.

Since the temperature in the optical filter 7 is maintained constant by the thermistor 20b disposed intimately close to the optical filter 7 and the second cooling device 21, the wavelength characteristic of the optical filter 7 can be stabilized to maintain the wavelength of the laser beam outputted from the semiconductor laser element 2 constant with improved accuracy.

Figure 5:
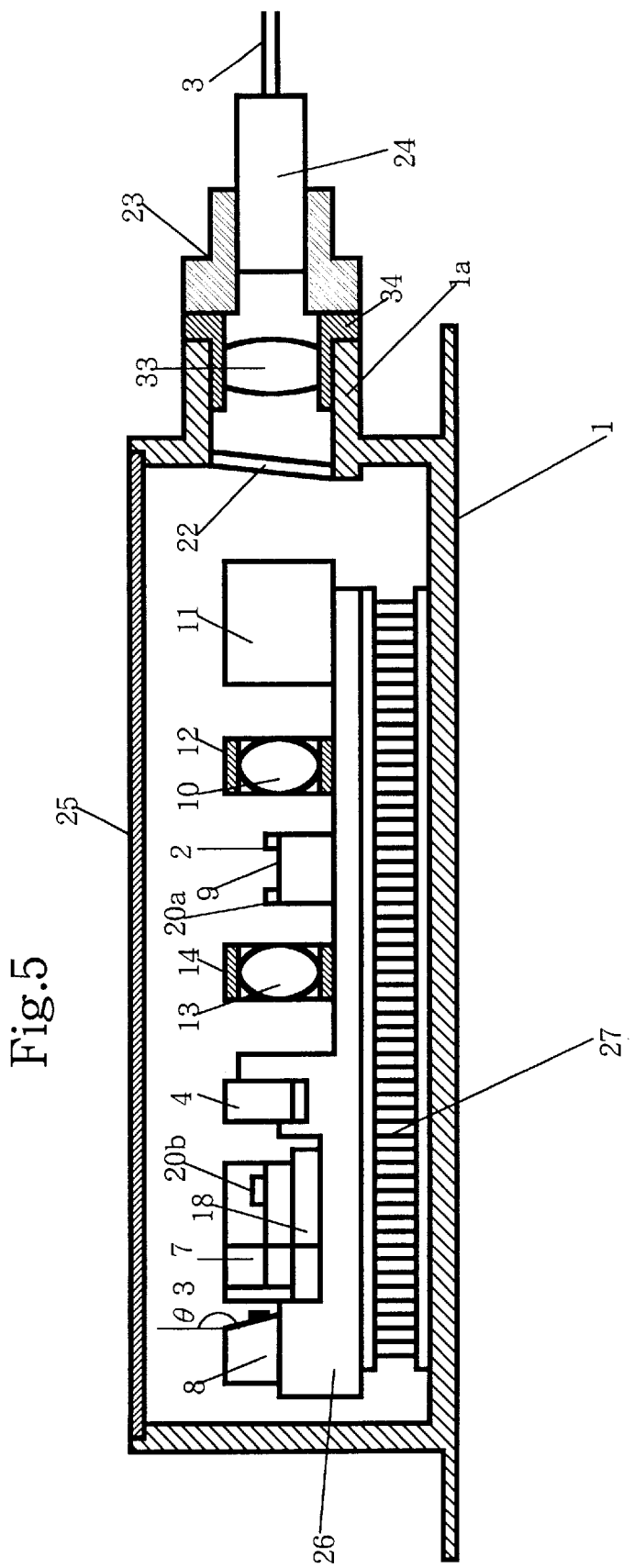
FIG. 5 is a side cross-sectional view of an optical module constructed according to the second embodiment of the present invention.

FIG. 5 is a side cross-sectional view of an optical module according to the second embodiment of the present invention. As shown in FIG. 5, the second embodiment provides a base member 26 of an integral structure combining the first and second bases 15, 19 and a cooling unit 27 of an integral structure combining the first and second cooling devices 16, 21. According to the second embodiment, the number of necessary parts can further be reduced and the manufacturing process can further be simplified.

Figure 6:
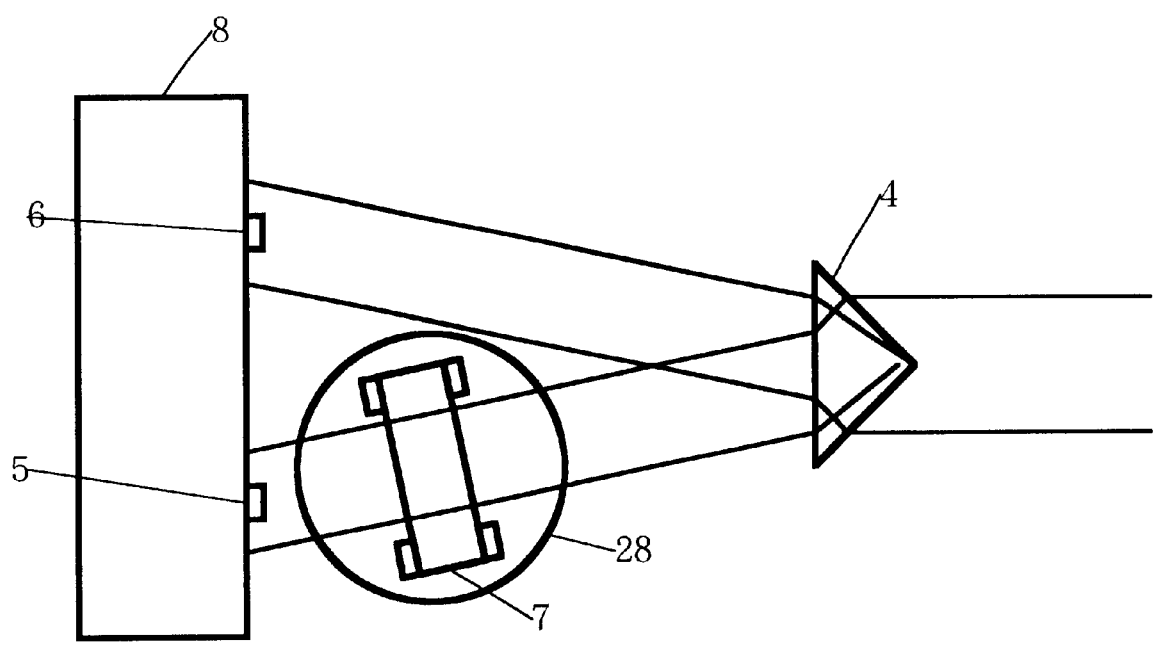
FIG. 6A is a plan view of an optical filter used in an optical module according to the third embodiment of the present invention and FIG. 6B illustrates a rotation of the optical filter.
Figure 6:
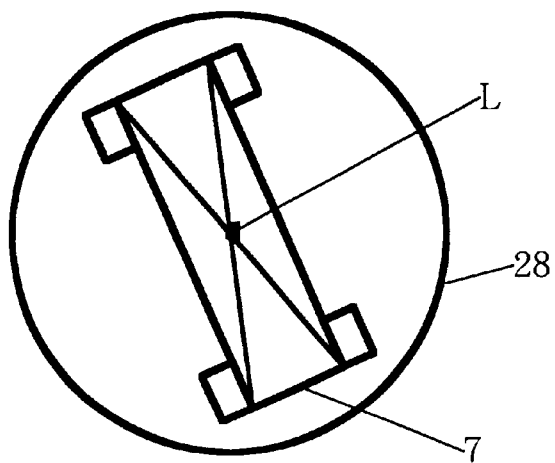
Figure 7:
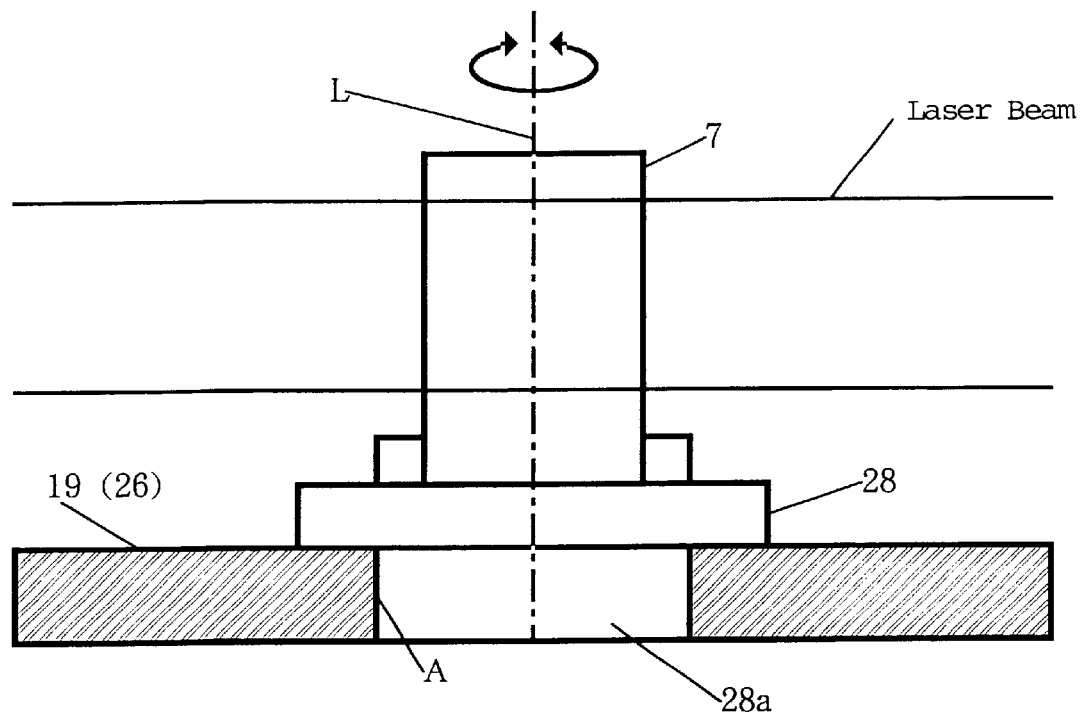
Figure 7:
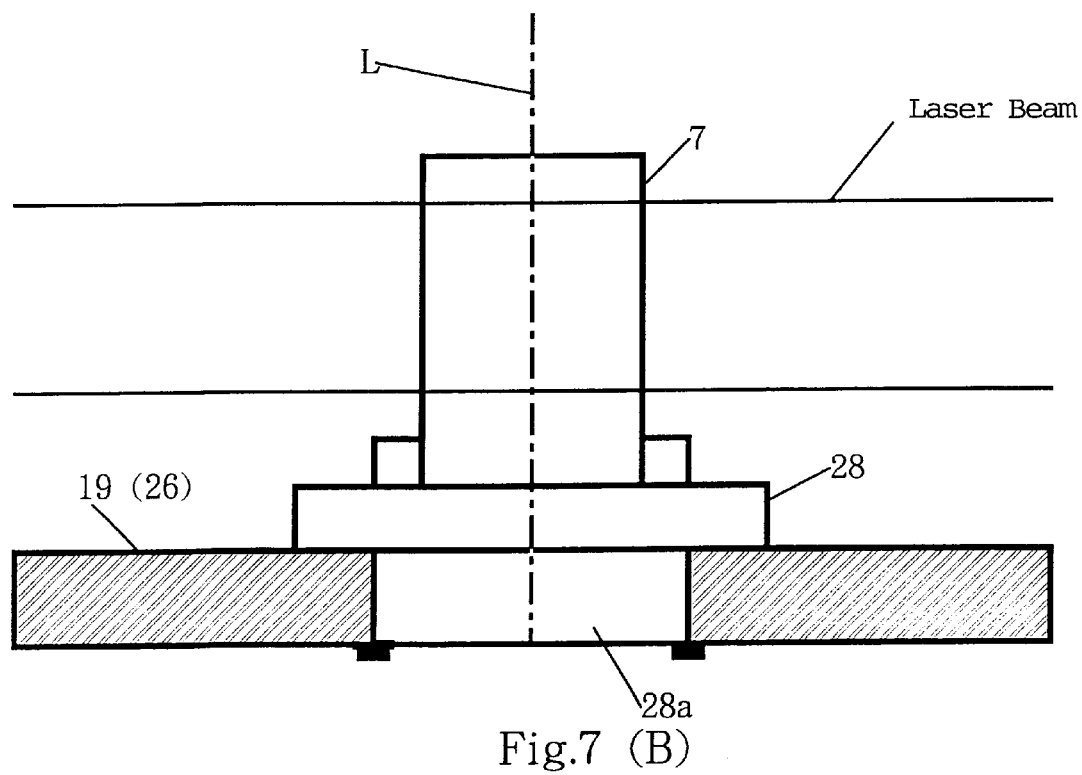

FIG. 6A is a plan view of an optical filter used in an optical module according to the third embodiment of the present invention while FIG. 6B illustrates the rotation of the optical filter. FIG. 7 is a side view of the optical filter shown in FIG. 6: FIG. 7A shows the optical filter rotatably supported on a base and FIG. 7B shows the optical filter fixedly mounted on the base.

Referring to FIGS. 6A and B, the optical filter 7 used in an optical module according to the third embodiment of the present invention is characterized by that it is fixedly mounted on a disc-shaped filter holder 28 that is rotatable about a rotation axis L perpendicular to the direction of incident laser beam. This rotation axis L is one that passes through the intersection between the diagonal lines in the square optical filter 7, as shown in FIG. 6B.

As shown in FIG. 7A, the optical filter 7 is fixedly mounted, at its bottom, on a filter holder 28 through low temperature glass or adhesive. The bottom of the optical filter 7 may be soldered to the filter holder 28 after it has been metallized. The underside of the filter holder 28 includes a cylindrical anchoring base 28a extending therefrom, which base 28a is inserted into a circular hole A formed in the base 19 (or 26) for rotation relative to the base 19 (or 26). After the angle in the optical filter 7 has been regulated while monitoring PD currents, the anchoring base 28a is fixed to the base 19 (or 26) at a position in which the desired wavelength characteristic of the optical filter 7 is provided, through YAG laser welding, as shown in FIG. 7B. A thermosetting adhesive may be charged into a gap between the anchoring base 28a and the base 19 (or 26) and heated to set such a thermosetting adhesive after the angle of the optical filter 7 has been regulated.

In such a manner, the filter holder 28 is supported on the base 19 (or 26) for rotational movement about the rotation axis L perpendicular to the direction of incident laser beam. Therefore, the optical filter 7 can more easily be aligned.

Figure 8:
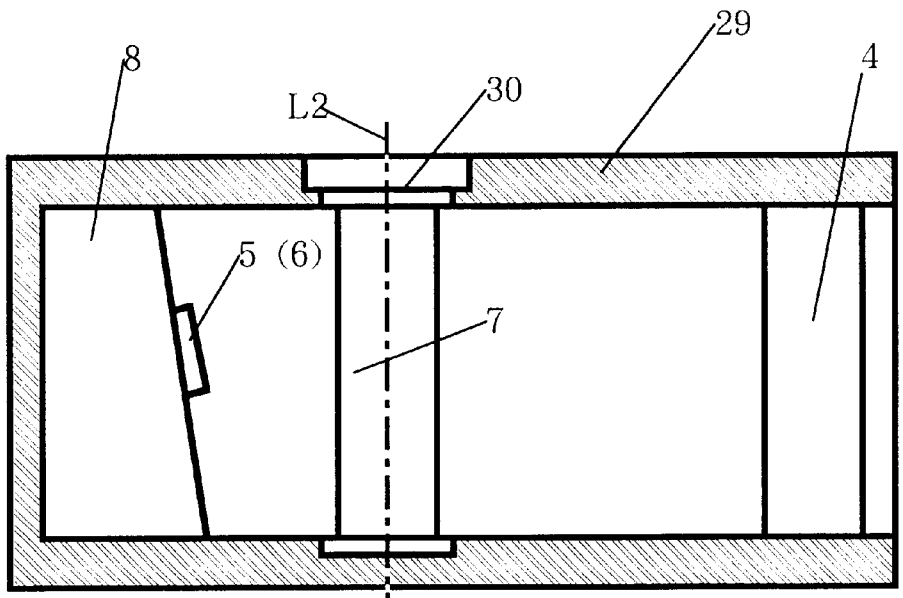
FIGS. 8A and B are side and plan cross-sectional views of a holder member used in an optical filter according to the fourth embodiment of the present invention.
Figure 8:
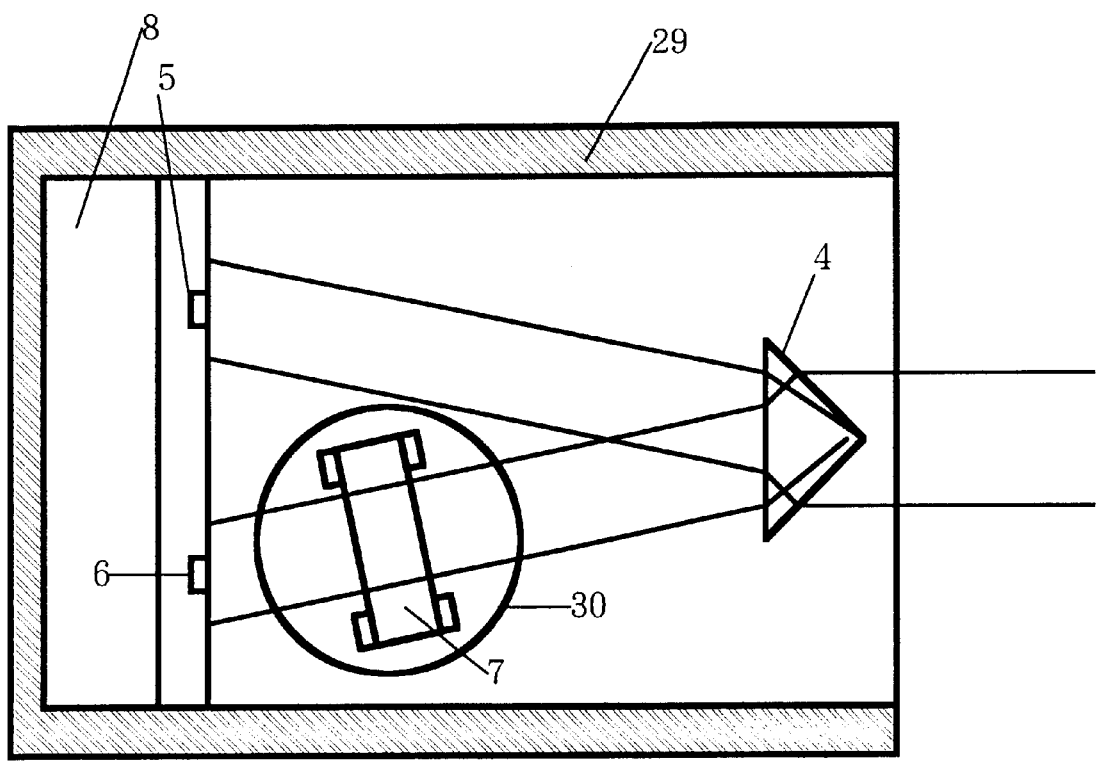
Figure 9:
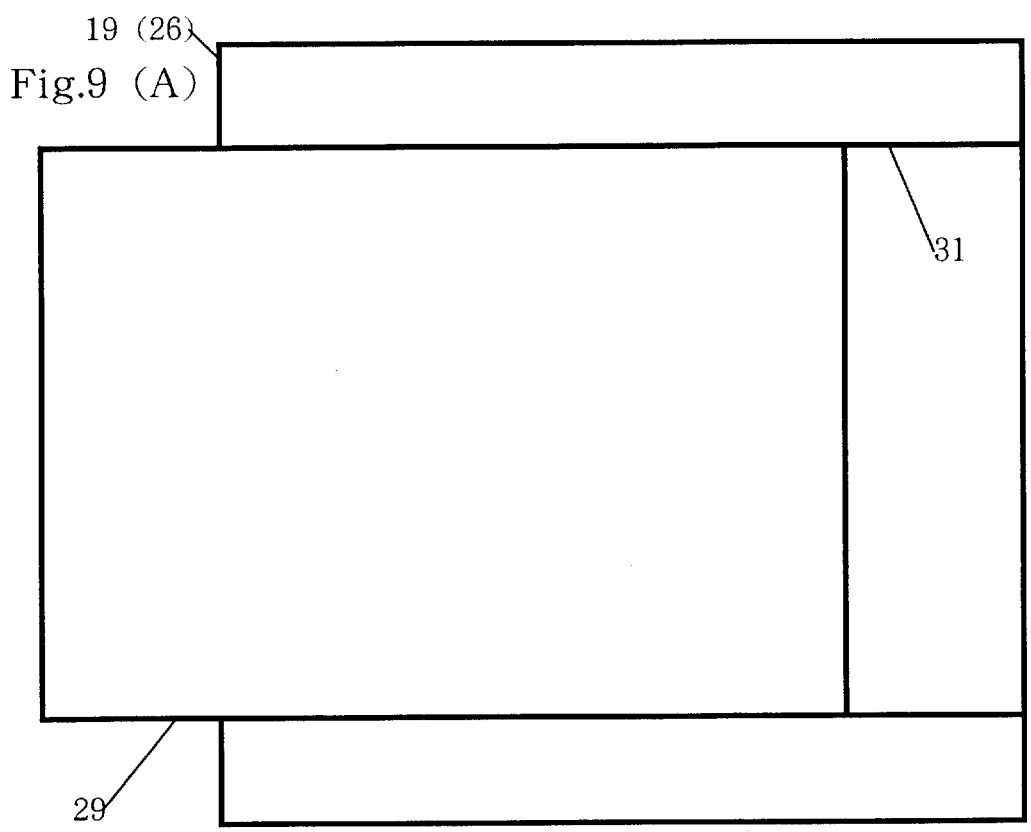
Figure 9:
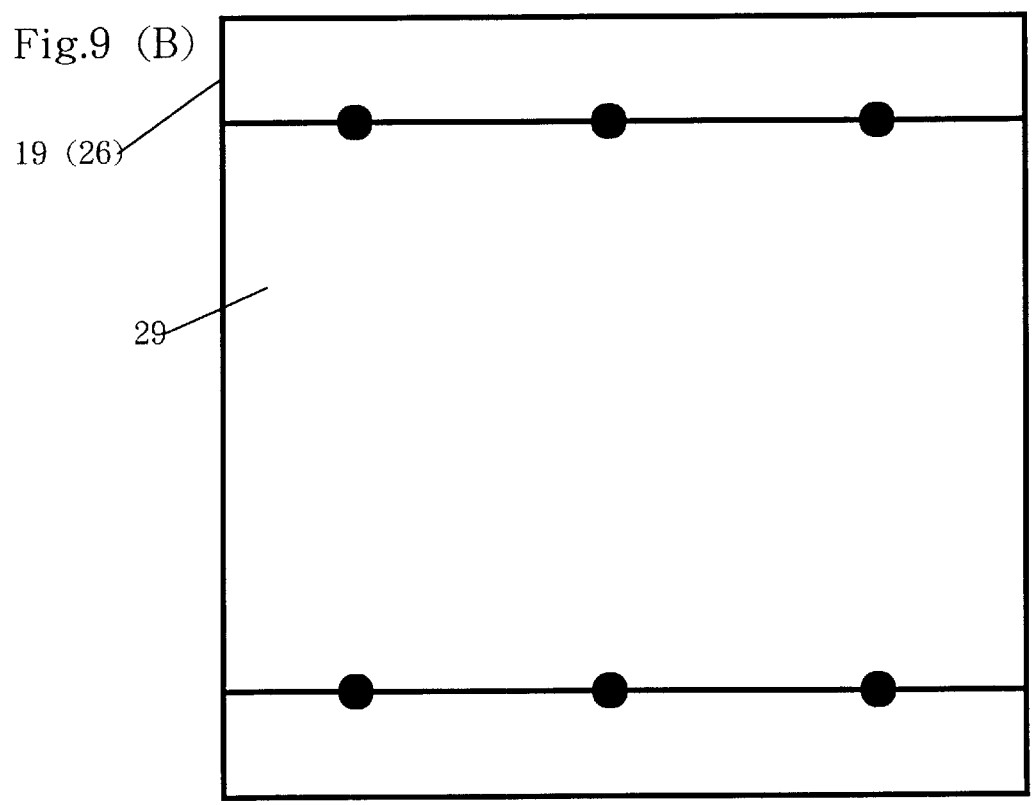
Figure 10:
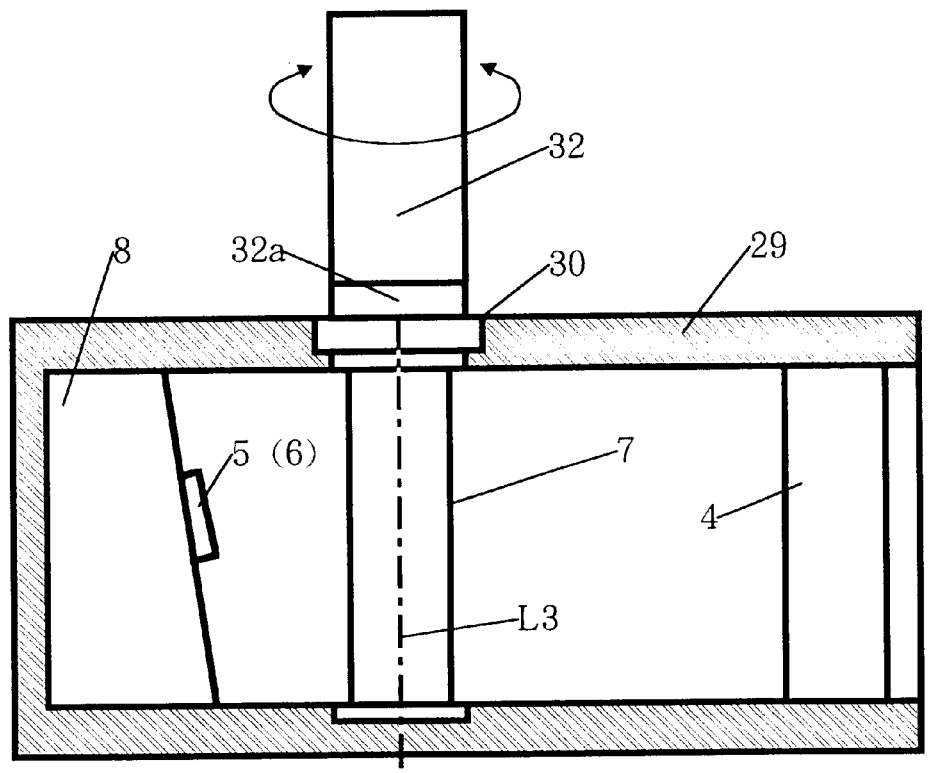
FIGS. 10A and B are side cross-sectional and plan views showing the state of the holder member of FIG. 8 when the optical filter is been angularly adjusted by an angle adjusting tool.
Figure 10:
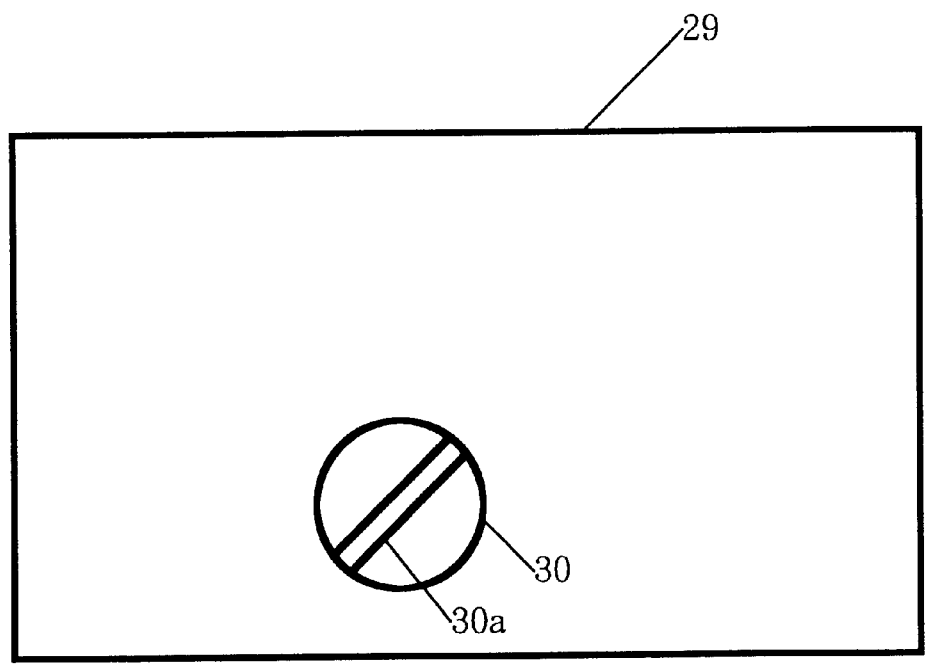

FIGS. 8A and B are side and plan cross-sectional views of a holder member used in an optical filter according to the fourth embodiment of the present invention; FIG. 9A is a plane view showing the holder member of FIG. 8 before it is fixedly mounted on the base while FIG. 9B is a plan view showing the same holder member after it has fixedly been mounted on the base; FIGS. 10A and B are side cross-sectional and plan views showing the state of the holder member of FIG. 8 when the optical filter is been angularly adjusted by an angle adjusting tool.

Referring to FIG. 8, the optical module according to the fourth embodiment of the present invention includes a prism 4, optical filter 7 and PD carrier 8, all of which are fixedly mounted in a holder member 29 consisting of a hollow metal block.

The optical filter 7 is mounted on a filter holder 30 that is fixedly mounted on the holder member 29 in such a manner as shown in connection with the third embodiment. The filter holder 30 is a part independently of the holder member 29 and can rotatably be aligned about a rotation axis L2 perpendicular to the direction of incident laser beam to regulate the angle of incident light onto the optical filter 7. The filter holder 30 is rotatably supported between the top and bottom of the holder member 29.

Referring to FIG. 9A, the base 19 (26) is formed with a groove portion 31 such that the holder member 29 can be aligned in such a state that the laser beam is not emitted from the semiconductor laser element 2, that is, in a passive alignment. The holder member 29 is inserted while meeting the side face thereof to the groove portion 31. This can simplify the aligning step. After the holder member 29 has been inserted into the groove portion 31 in the base 19 (26), a YAG laser beam is irradiated to the contacting area therebetween to perform the welding, as shown in FIG. 9B. FIG. 9B shows six YAG welding spots represented by black circles. The laser welding may be replaced by the soldering or adhesive.

As shown in FIG. 10A, the top face of the filter holder 30 is externally exposed through the top of the holder member 29. As shown in FIG. 10B, for example, the exposed top may be formed with a fitting groove 30a into which the tip portion 32a of an angle regulating tool 32 is engaged, the angle regulating tool 32 being then rotated to regulate the angle in the optical filter 7. This facilitates the regulation of angle in the optical filter 7. Moreover, the exposed top of the filter holder 30 may be formed with a protrusion that is adapted to engage into a fitting groove in the angle regulating tool 32. In addition, the filter holder 30 may magnetically be rotated to regulate the angle in the optical filter 7 when the tip face of the angle regulating tool 32 is in contact with the top of the filter holder 30. In any event, the angle in the optical filter 7 can easily be regulated in the limited space within the package 1.

FIG. 11A is a plan view illustrating the structure and function of a prism used in an optical module according to the fifth embodiment of the present invention while FIG. 11B is a perspective view of the prism.

Referring to FIGS. 11A and B, the fifth embodiment uses a roof type prism 4 having a pentagonal configuration as viewed in a plane, the prism having two sloped faces 4a and 4b that receive an incident light and divides it into two light portions. The prism 4 is symmetrical about the axis M. The sloped (or light entering) faces 4a and 4b in the prism 4 are coated with an AR film having no polarizing property or the like. The arrangement is made such that the incident light collimated by the collimating lens 13 enters the ridgeline 4d and adjacent area of the prism 4 including the sloped faces 4a and 4b.

When the light enters the area adjacent to the ridgeline 4d, an angle θ4 included between each of the sloped faces 4a, 4b in the prism 4 and the normal in the incident light (as shown by R in FIG. 1A) becomes the angle of incident light in the prism 4. This angle of incidence θ is preferably as small as possible for reducing the loss in the polarization dependency. When the angle of incidence θ4 is equal to or smaller than 65 degrees, the loss in the polarization dependency can effectively be reduced. Practically, the angle of incidence θ4 is determined, for example, between 10 degrees and 65 degrees, depending on the dimensions of the photodiodes 5, 6 and prism 4 that are used in the measurement.

Figure 11:
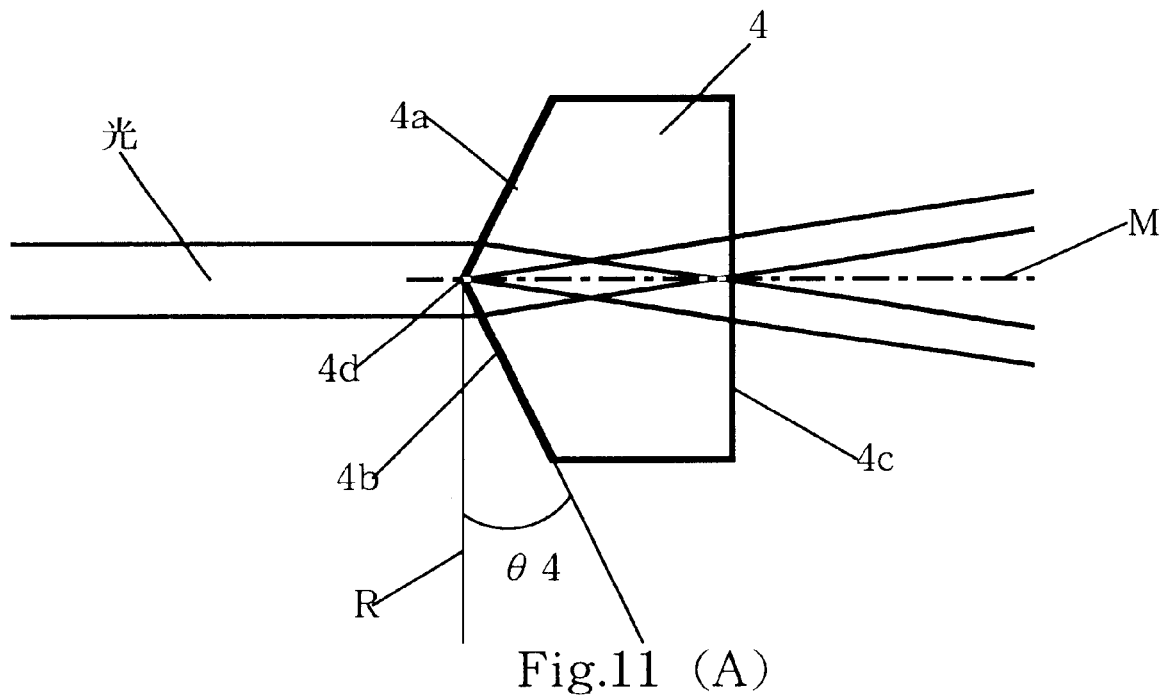
Figure 11:
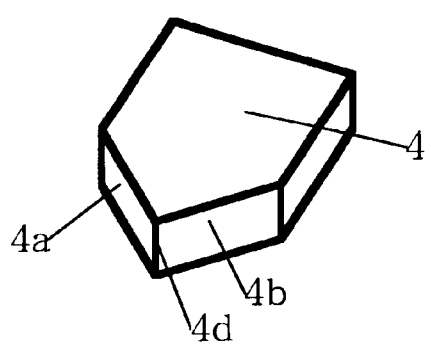
Figure 12:
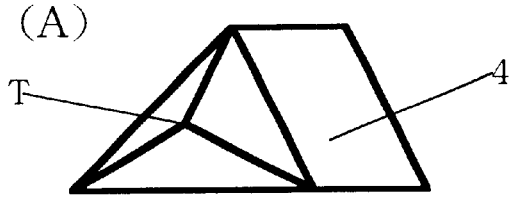
FIGS. 12A–D show several modified prisms.
Figure 12:
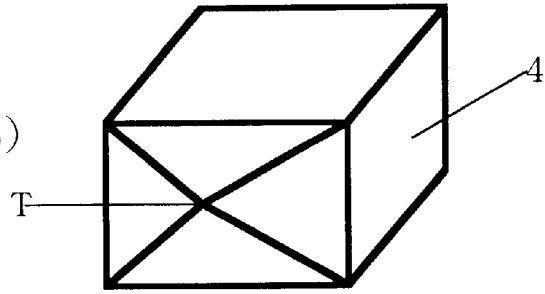
Figure 12:
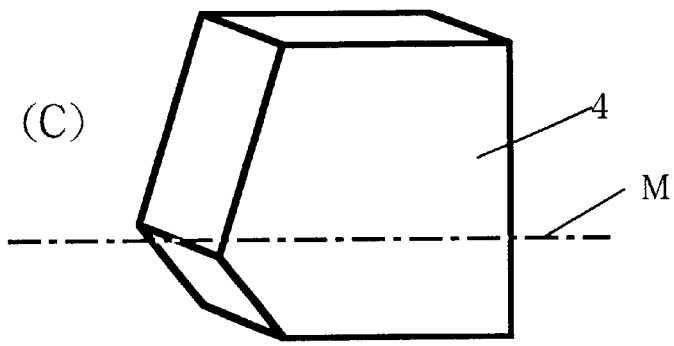
Figure 12:
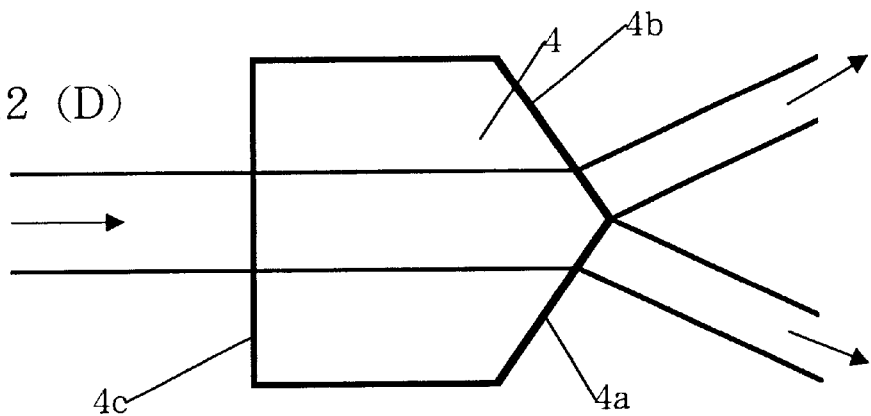
Figure 13:
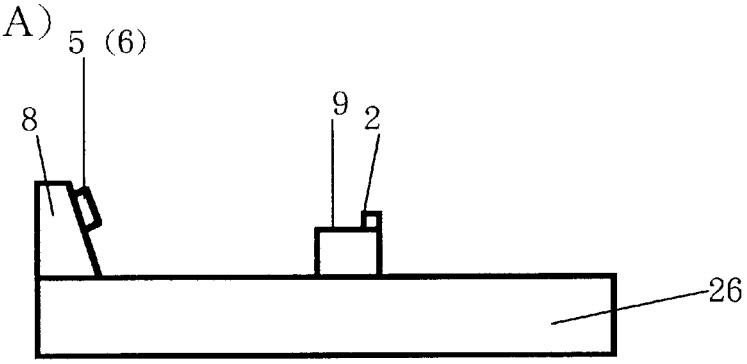
FIGS. 13A–D schematically illustrate a process of making an optical module according to the sixth embodiment of the present invention.
Figure 13:
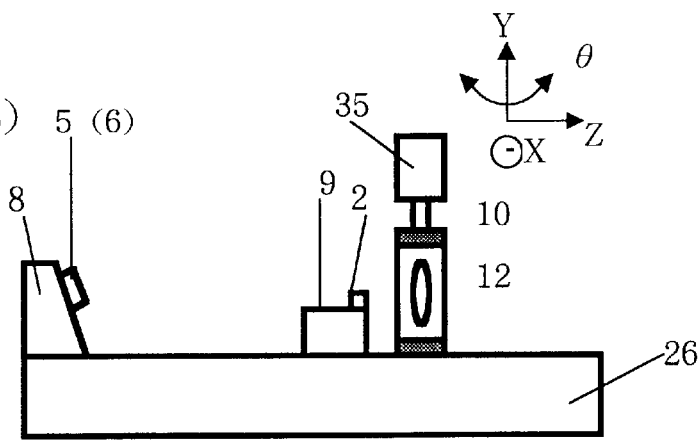
Figure 13:
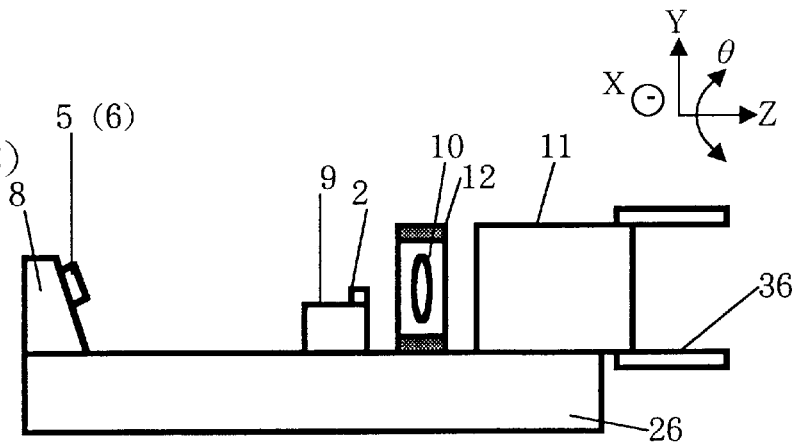
Figure 13:
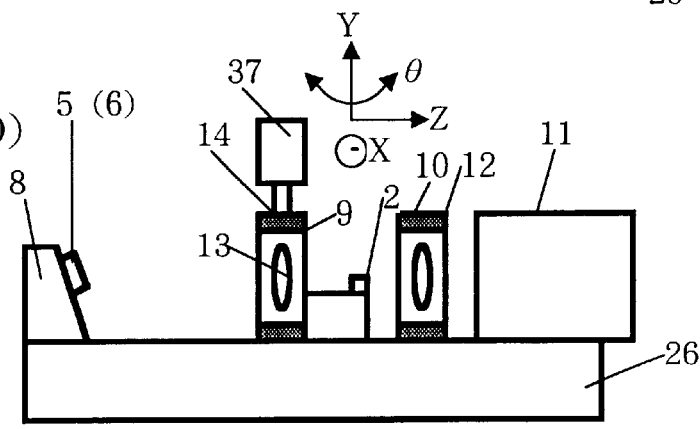
Figure 14:
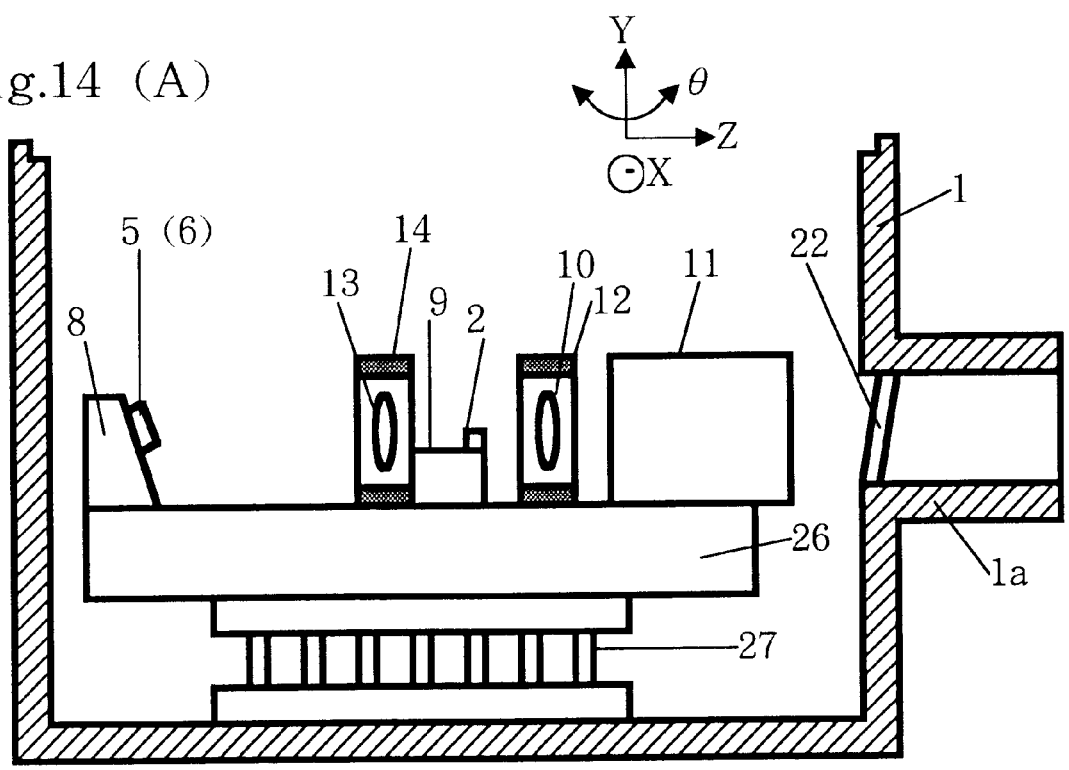
FIGS. 14A and B schematically illustrate the process of making the optical module according to the sixth embodiment of the present invention.
Figure 14:
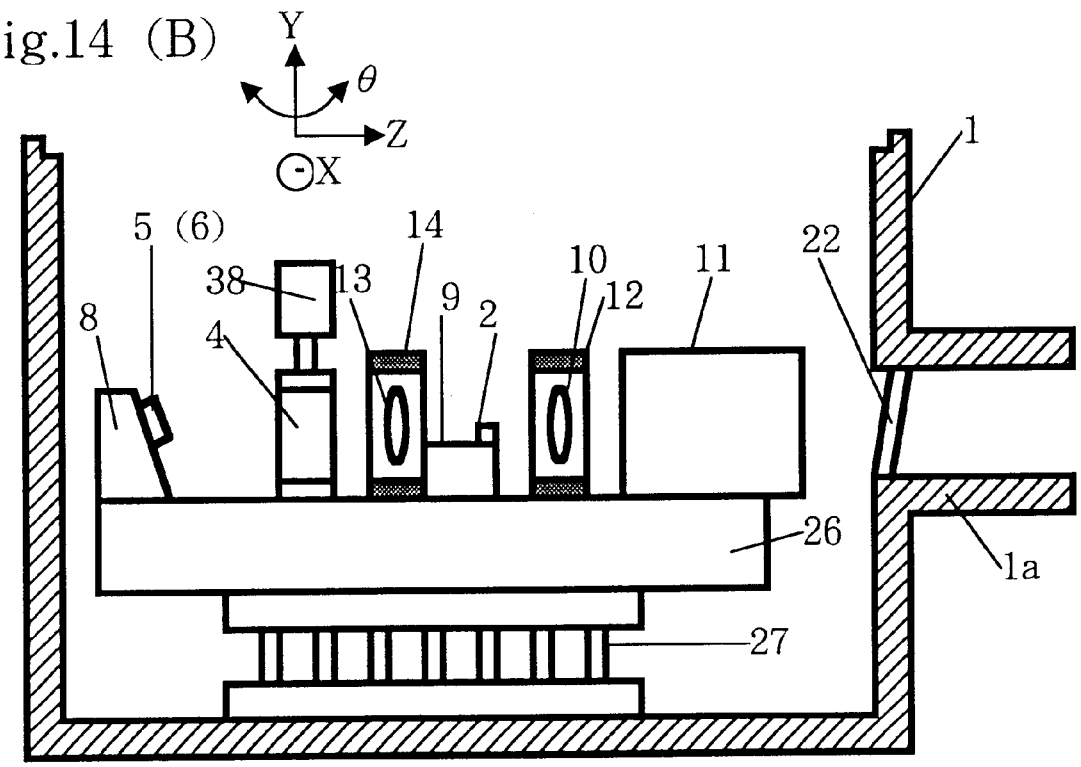
Figure 15:
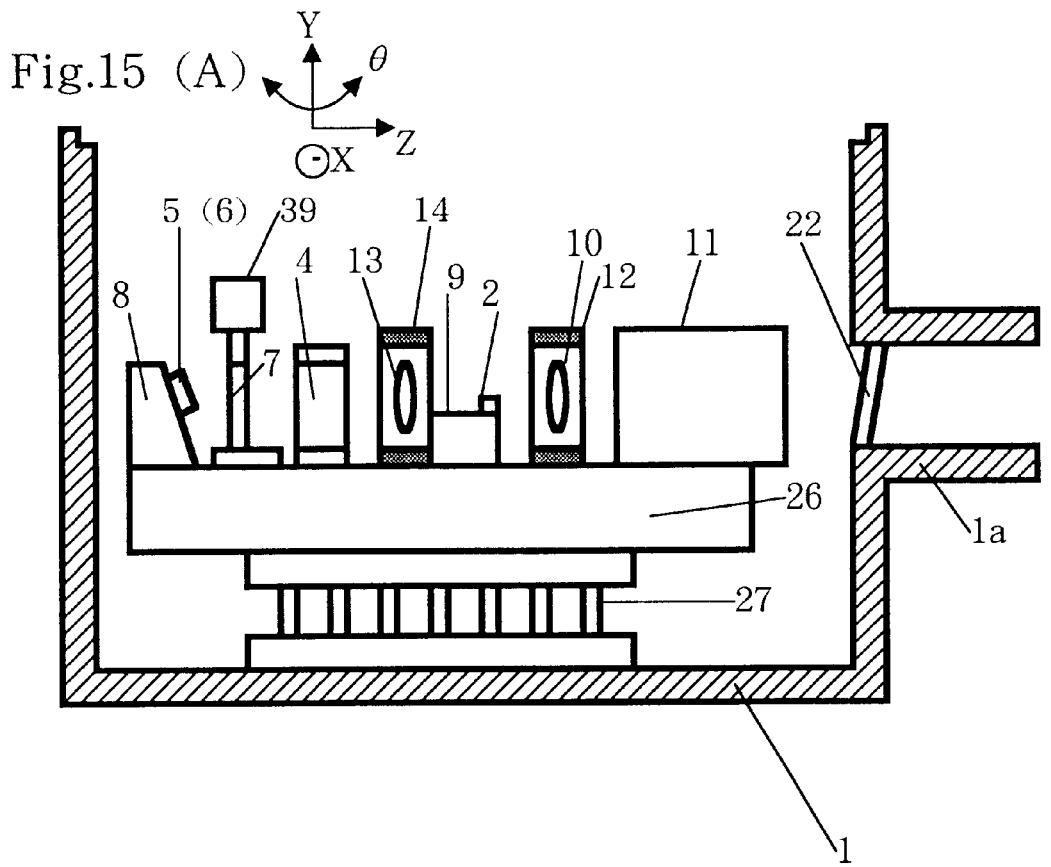
FIGS. 15A and B schematically illustrate the process of making the optical module according to the sixth embodiment of the present invention.
Figure 15:
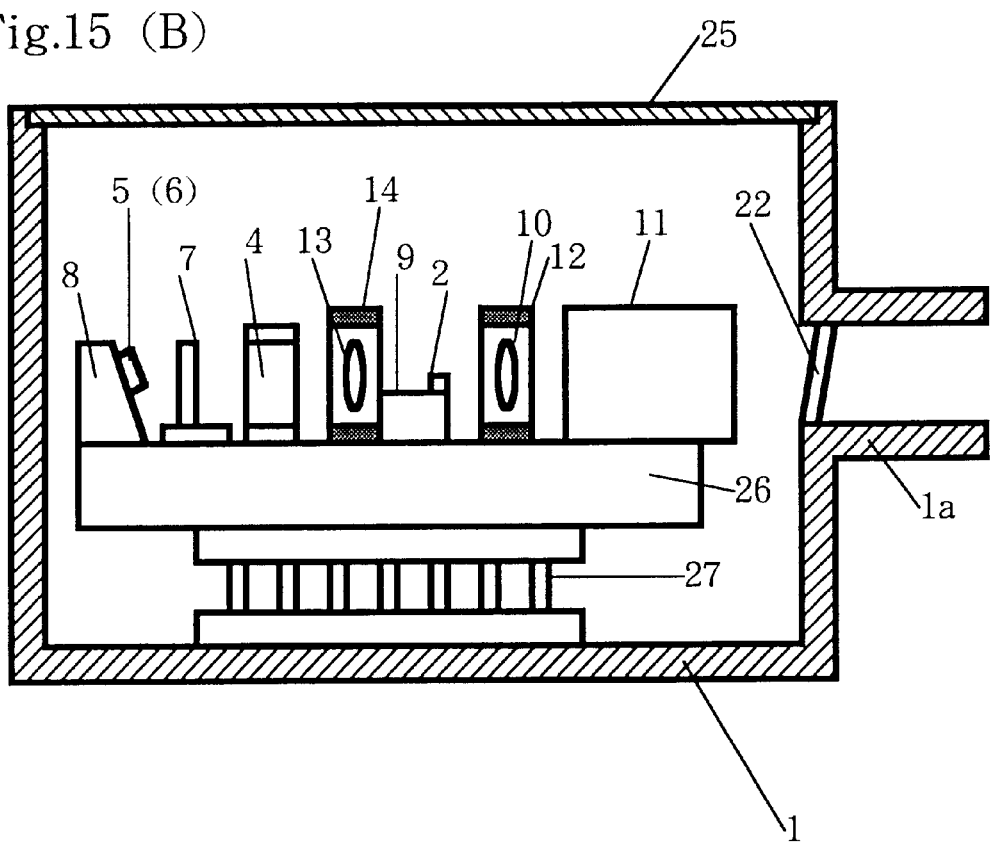
Figure 16:
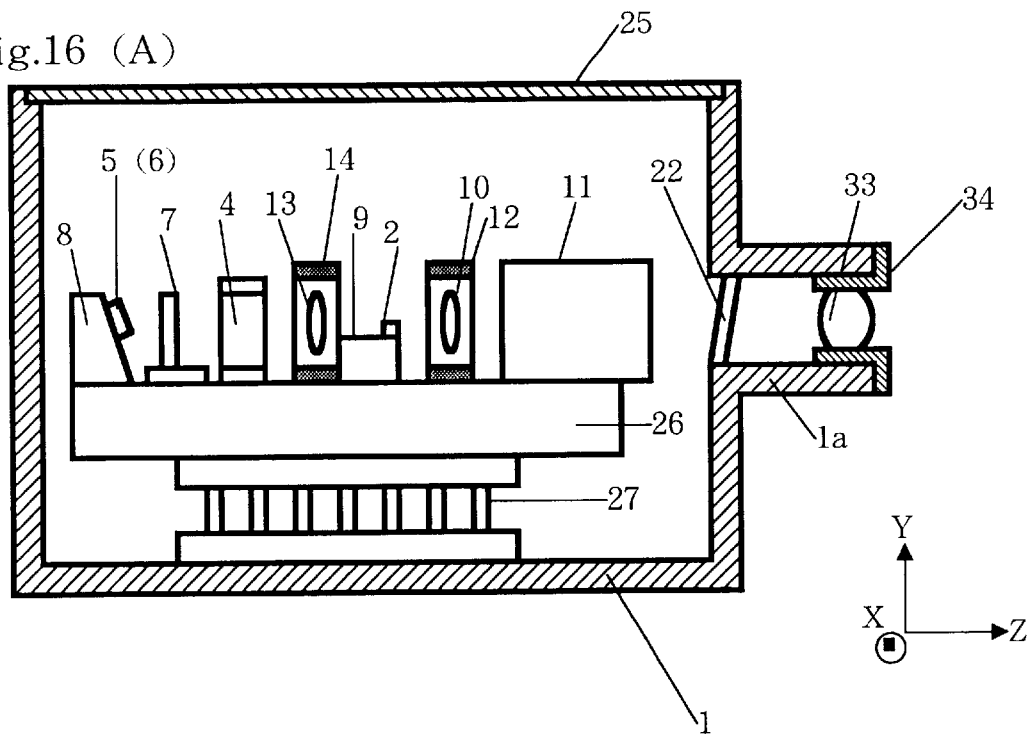
FIGS. 16A and B schematically illustrate the process of making the optical module according to the sixth embodiment of the present invention.
Figure 16:
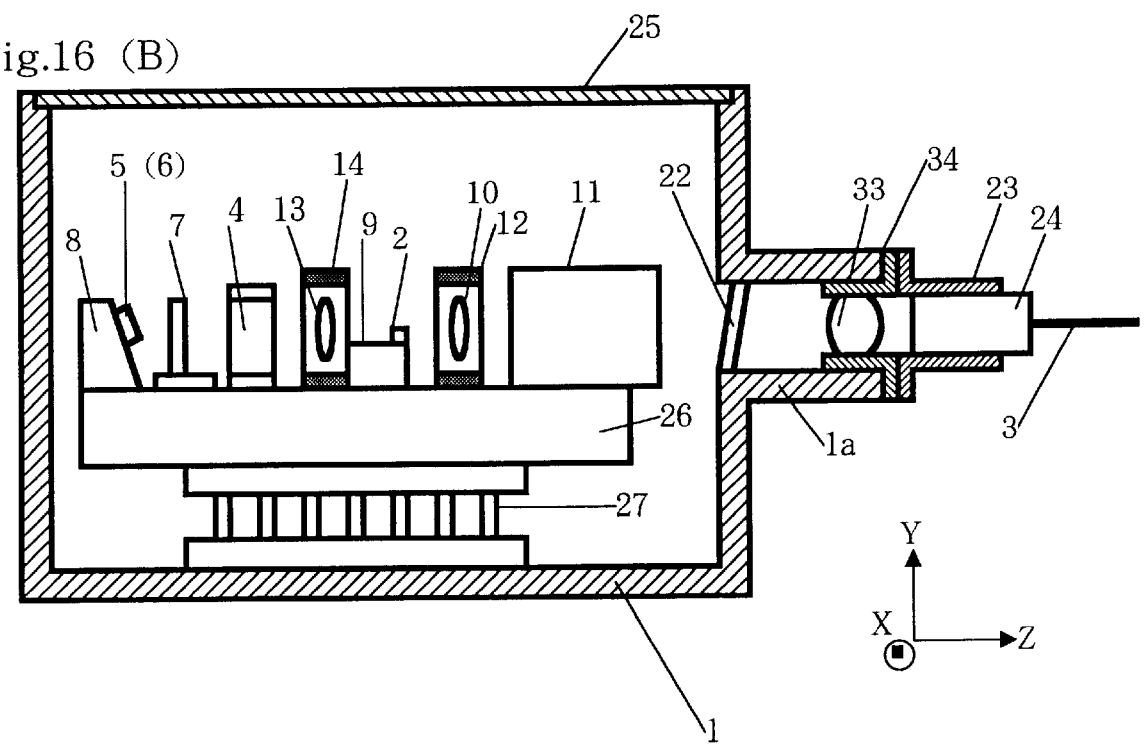

FIGS. 12A–D show several modified prisms. Although FIG. 11 shows the roof prism 4, the latter may be formed into such shapes as shown in FIG. 12A. The prism 4 shown in FIG. 12A divides the light incident thereon near the vertex T into three light portions while the prism 4 shown in FIG. 12B divides the light incident thereon near the vertex T into four light portions. The prism 4 may be of a roof configuration asymmetrical relative to the axis M, as shown in FIG. 12C.

In such a roof prism 4 as shown in FIG. 12D, a flat face 4c thereof opposite to the incident faces may receive the light and divide it into two light portions. Considering the reflection of the light from the incident faces of the prism 4 toward the semiconductor laser element 2, however, it is preferred that the sloped faces 3a and 3b form the incident faces as shown in FIGS. 1 and 11.

FIGS. 13–16 schematically illustrate a process of making an optical module according to the sixth embodiment of the present invention.

Referring first to FIG. 13A, the LD carrier 9 on which the semiconductor laser element 2 has been mounted and the PD carrier 8 on which the photodiodes 5 and 6 have been mounted are positioned on the base 26 in place through the passive alignment and fixedly soldered thereto. The soldering material used may be AuSn or the like.

As shown in FIG. 13B, the laser beam is then emitted from the front end face of the semiconductor laser element 2. By using the emitted laser beam, the first lens holder 12 for holding the collimating lens 10 is aligned relative to X-Y-Z-θ axis directions through an aligning tool 35. After aligned, the first lens holder 12 is fixed to the base 26 in place through YAG laser welding.

As shown in FIG. 13C, the optical isolator 11 is aligned relative to the X-Y-Z-θ axis directions through an aligning tool 36 and fixed to the base 26 in place through YAG laser welding. Such a step may be omitted if the optical isolator 11 is to be not mounted on the base 26.

As shown in FIG. 13D, the second lens holder 14 for holding the collimating lens 13 is then aligned relative to the X-Y-Z-θ axis directions through an aligning tool 37 without emitting the laser beam from the back end face of the semiconductor laser element 2 or in the passive alignment and fixed to the base 26 in place through YAG laser welding.

As shown in FIG. 14A, the base 26 is then fixedly soldered on the cooling device 27.

Next, the semiconductor laser element 2, the photodiodes 5 and 6 are electrically connected to leads (not shown) in the package 1 through gold wires (not shown)

Next, as shown in FIG. 14B, the prism 4 is aligned relative to the X-Y-Z-θ axis directions through an aligning tool 38 to provide the desired current values while monitoring the PD currents outputted from the photodiodes 5 and 6. The aligned prism 4 is then fixed onto the base 26 in place through YAG laser welding.

Next, as shown in FIG. 15A, the optical filter 7 is aligned relative to the X-Y-Z-θ axis directions through an aligning tool 39 to provide the desired wavelength characteristic (or wavelength discriminating curve) while monitoring the PD currents outputted from the photodiodes 5 and 6. Once aligned, the optical filter 7 is fixed onto the base 26 through YAG laser welding.

Next, the thermistors 20a and 20b are electrically connected to leads (not shown) in the package 1 through gold wires (not shown).

Next, as shown in FIG. 15B, the lid portion 25 is placed over the opened top of the package 1 within the atmosphere of inert gas (e.g., $N_2$ or Xe), the outer periphery thereof being then resistance-welded to the package to hermetically seal it.

Next, as shown in FIG. 16A, the third lens holder 34 for holding the condensing lens 33 is placed within the flange portion 1a of the package 1 and aligned relative to the flange portion 1a in the X-Y plane and in the Z-axis direction. The third lens holder 34 is fixed in the flange portion 1a through YAG laser welding such that the light rays exiting from the condensing lens 33 are made parallel to the center axis of the flange portion 1a in the package 1.

Finally, the optical fiber 3 is aligned and fixed. In this step, the metallic slide ring 23 is fixedly mounted on the outer end of the third lens holder 34. The slide ring 23 is fixed onto the outer end of the third lens holder 34 at the boundary therebetween through YAG laser welding after the slide ring 23 has been positioned in the plane perpendicular to the optical axis of the optical fiber 3 (X-Y plane). The ferrule 24 holding the optical fiber 3 is fixed in the interior of the slide ring 23 through YAG laser welding at a position wherein the outgoing beam in the optical fiber 3 is maximized. Thus, the optical axis direction (Z-axis direction) in the optical fiber 3 is fixedly positioned.

In such an embodiment, the semiconductor laser element 2, one PD carrier 8 on which the first and second photodiodes 5, 6 and lenses are fixedly mounted and lenses are initially positioned in such a state that the laser beam is not emitted from the semiconductor laser element 2 (not depending on the amount of light and the optical-axis measurement), that is, according to the passive alignment. Thereafter, the laser beam is emitted from the semiconductor laser element 2 and the prism 4 is aligned and positioned relating to the position and angle thereof, based on the current values detected by the first and second photodiodes 5, 6 in such a typical manner that the two current values are substantially equal to each other, that is, according to the active alignment.

According to such a procedure, the semiconductor laser element 2, one PD carrier on which the first and second photodiodes 5, 6 and lenses can more easily be positioned through the passive alignment. Additionally, the alignment of the prism can absorb variations in the optical axis and amount of PD entering light associated with variations in arrangement of these optical parts. Thus, the light can surely enter the first and second photodiodes 5, 6. And yet, the currents detected by the first and second photodiodes 5, 6 can also be regulated with the desired balance.

Therefore, the sixth embodiment can further reduce the manufacturing cost and time of the optical module, than the first embodiment. The sixth embodiment can also produce the optical module having its improved wavelength stability for laser beam in a stable manner.

Figure 17:
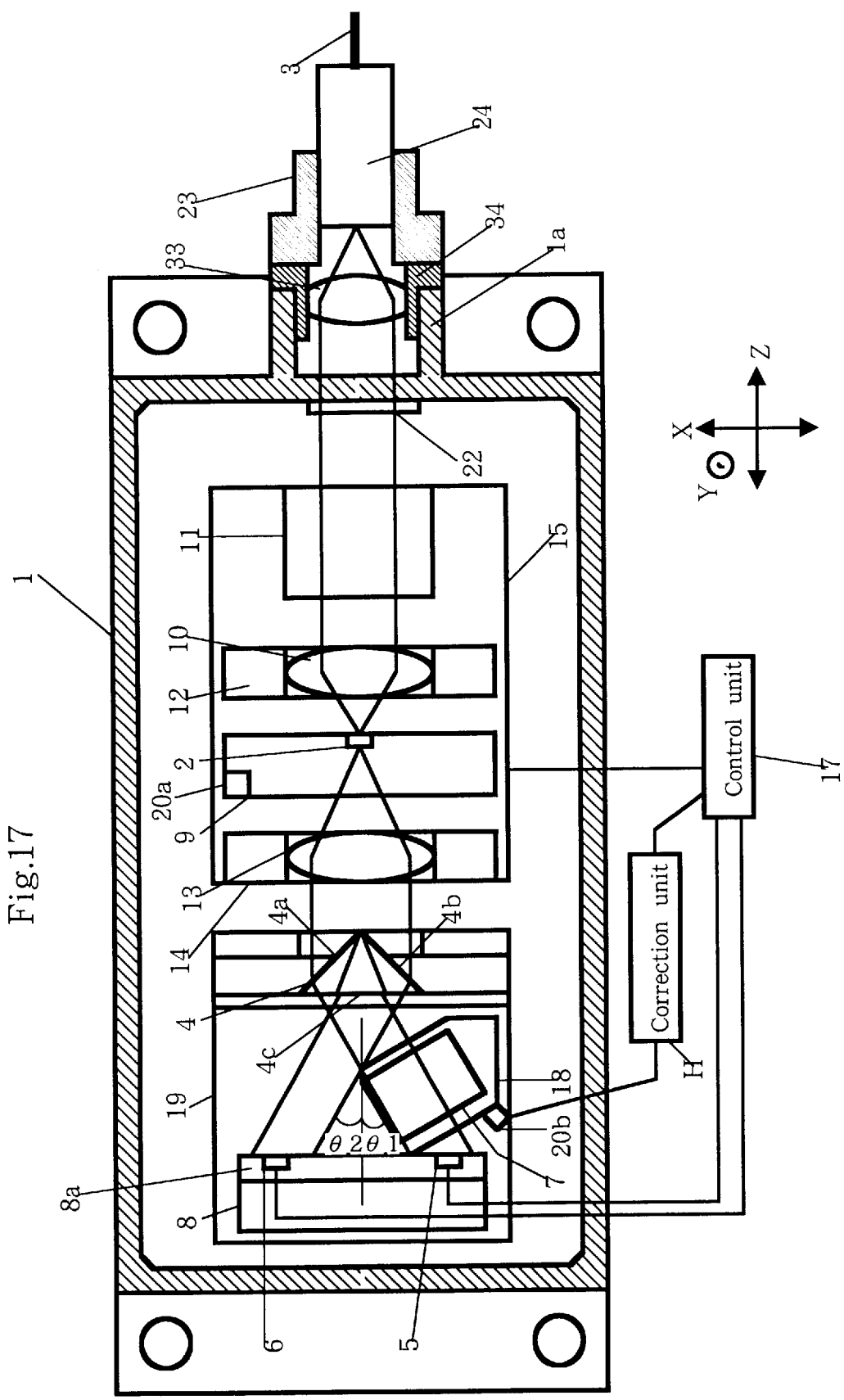
FIG. 17 is a plan cross-sectional view of an optical module according to the seventh embodiment of the present invention.

FIG. 17 is a plan cross-sectional view of an optical module according to the seventh embodiment of the present invention.

The optical parts used in the aforementioned embodiments, such as the optical filter 7, prism 4 and others, have the temperature dependencies in the optical characteristics thereof. Thus, these parts are controlled for their temperatures to be maintained constant through the second or first cooling device 21 or 16. However, they are always influenced by changes in the external temperature outside of the module. Thus, the control of temperature in the second cooling device 21 may not follow the variations of temperature in the optical parts. If the temperature in such optical parts and particularly the optical filter 7 is variable, the output values of the two PD currents are correspondingly variable. This may more or less change the wavelength of the laser beam outputted form the semiconductor laser element 2.

To avoid such a problem, the seventh embodiment is provided with a correction unit H that includes a circuit for receiving a temperature detection signal outputted from a thermistor 20b located adjacent to or on the filter holder 18 as shown in FIG. 3 and for outputting a temperature correction signal toward the control unit 17, as shown in FIG. 17. The other components are substantially similar to those of the optical module according to the first embodiment. The temperature correction signal outputted from this correction unit H is used to correct the temperature controlled by the first cooling device 16 such that the wavelength in the laser beam outputted from the semiconductor laser element 2 will be maintained constant. Thus, the wavelength in the laser beam outputted from the semiconductor laser element 2 can be maintained constant with very high accuracy.

Figure 18:
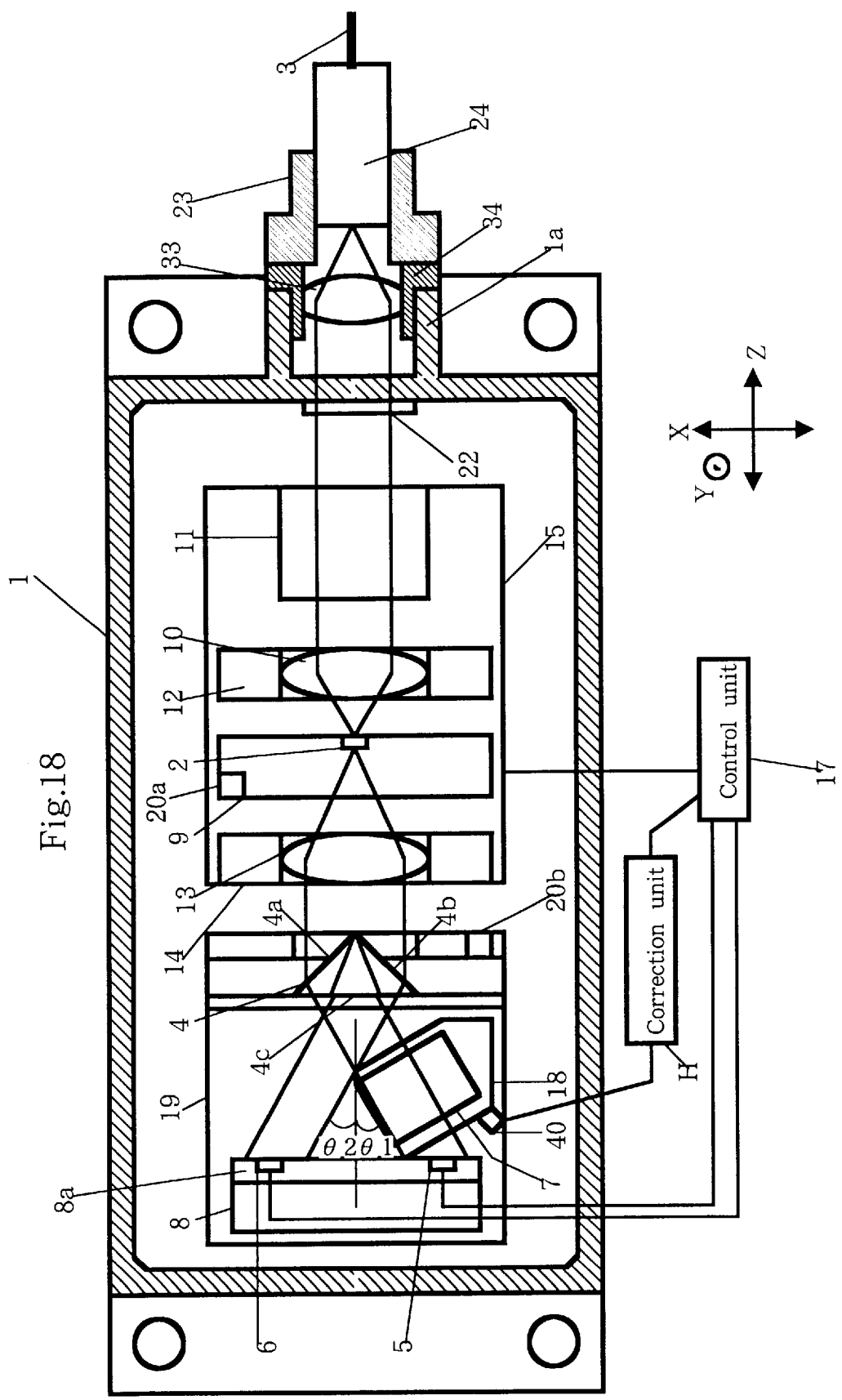
FIG. 18 is a plan cross-sectional view of an optical module according to the eighth embodiment of the present invention.

FIG. 18 is a plan cross-sectional view of an optical module according to the eighth embodiment of the present invention. In the eighth embodiment, a temperature correction thermistor 40 may be located near the optical filter 7 and connected with the correction unit H, separately of the thermistor 20b.

In the eighth embodiment, the thermistor 20b is shown as to be formed on a protrusion 19d of the second base 19 (see FIG. 3).

The present invention is not limited to the aforementioned forms, but may be carried out in any of various modified or changed forms within the technical scope as defined in the appending claims. For example, the optical filter 7 may be disposed between the prism 4 and the second photodiode 6. Furthermore, the prism 4 is designed to divide the incident laser beam into two beam components that are inclined with different angles relative to the optical axis.

Figure 19:
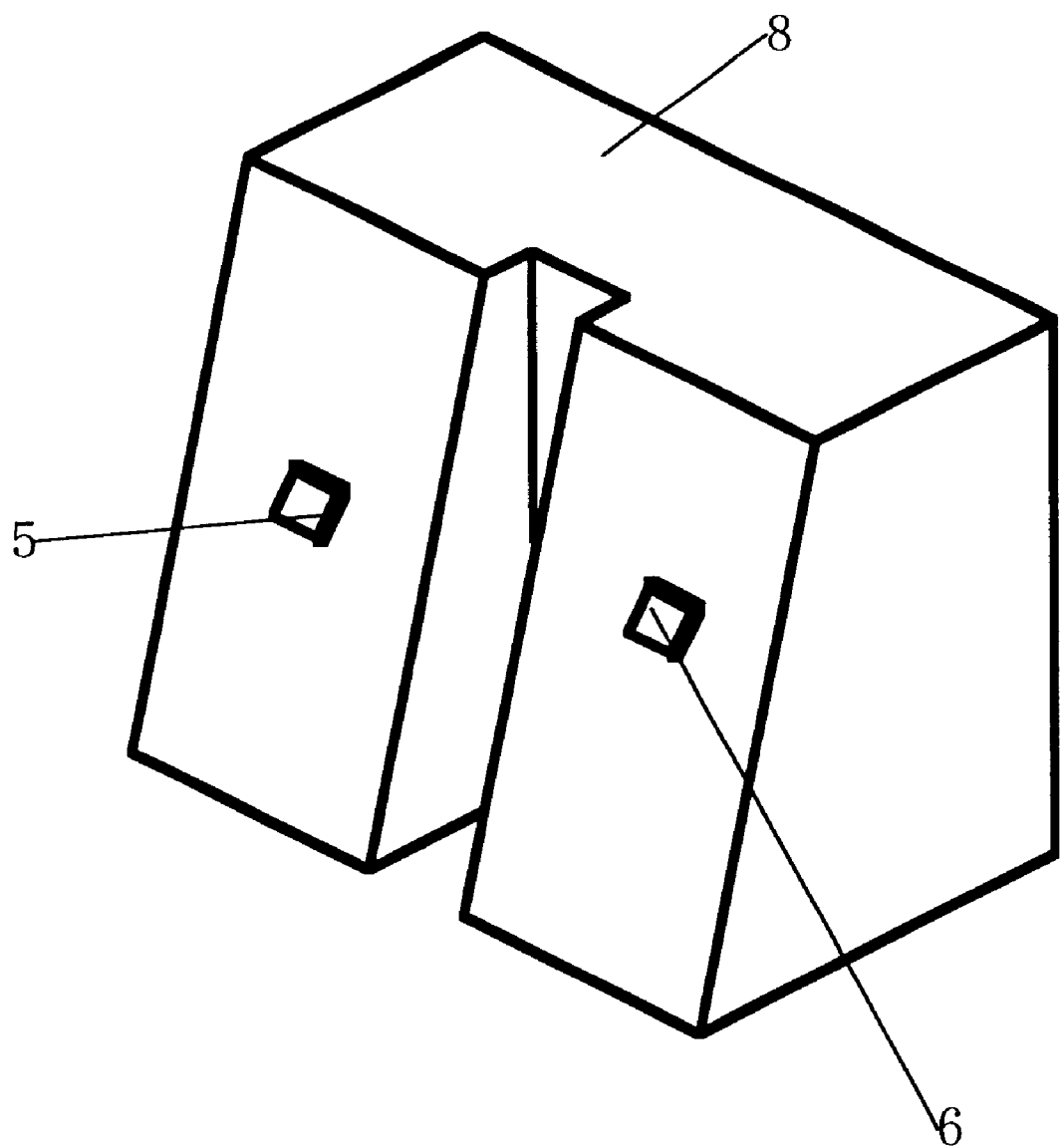
FIG. 19 is a perspective view of another structure of PD carrier.
Figure 20:
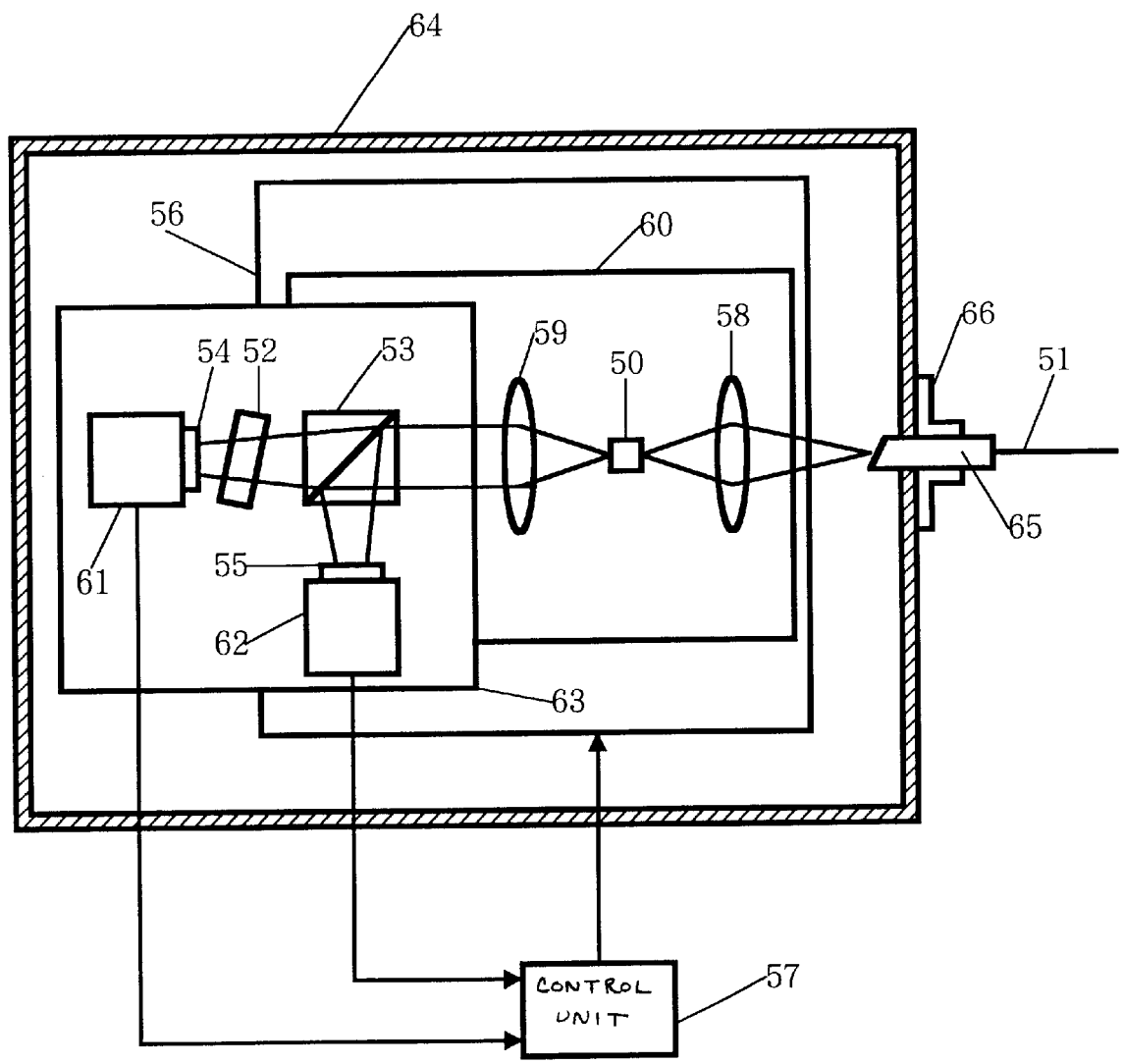
FIG. 20 shows the structure of an optical module according to the prior art and having a wavelength monitor mounted therein.

Additionally, the first and second photodiodes 5, 6 may respectively be mounted on separate mount surfaces as shown in FIG. 19. From the viewpoint of facilitating the optical alignment, it is preferred that these photodiodes are mounted on the same plane.

Additionally, the output strength in the laser beam outputted from the semiconductor laser element 2 may be controlled based on the output (PD current) from the second photodiode 6.

The control unit aspects of this invention may be conveniently implemented using a conventional general purpose digital computer, digital signal processor or microprocessor programmed according to the teachings of the present specification, as will be apparent to those skilled in the computer art. Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product that is a storage medium including instructions that can be used to program a computer to perform a process of the invention. The storage medium can include, but is not limited to semiconductor memory including ROMs, RAMs, EPROMs, EEPROMs, magnetic memory including floppy disks or hard disks, and optical media such as optical disks, all of which are suitable for storing electronic instructions.

Obviously, additional numerous modifications and variations of the present invention are possible in light of the above teachings. It is therefore to be understood that within the scope of the appended claims, the present invention may be practiced otherwise than as specifically described herein.

What is claimed is:

1. An optical module comprising:
   a light-emitting device configured to output a laser beam at one facet and a monitoring laser beam at another facet;
   an optical fiber configured to receive the laser beam and couple the laser beam therein;
   a beam splitter configured to split the monitoring laser beam into a first laser beam component and a second laser beam component that are respectively inclined relative to an optical axis of the monitoring laser beam within a predetermined angle less than 90 degrees;
   a first photo detector configured to produce a first electrical signal in response to receiving the first laser beam component;
   a second photo detector configured to produce a second electrical signal in response to receiving light from the second laser beam component;
   an optical filter disposed between the second photo detector and the beam splitter and for permitting only a laser beam having a predetermined wavelength range to transmit therethrough; and
   a mount member on which both the first and second photo detectors are mounted.

2. The optical module as defined in claim 1 wherein said first and second photo detectors are fixedly mounted on said mount member in a same plane.

3. The optical module as defined in claim 1 wherein said beam splitter is configured to divide the monitoring laser beam into the first laser beam component and the second laser beam component which are inclined relative to the optical axis with a substantially same angle.

4. The optical module as defined in claim 1 wherein said beam splitter is a prism.

5. The optical module as defined in claim 4 wherein said prism is a roof prism having two sloped faces disposed into a roof configuration and wherein the monitoring laser beam entering the prism through both of said two sloped faces is divided into two laser beam components.

6. The optical module as defined in claim 5 wherein the predetermined angle is an angle of incident light in said prism that is equal to or smaller than 65 degrees.

7. The optical module as defined in claim 1 wherein said beam splitter, said optical filter and said mount member are fixedly mounted on a common holder member.

8. The optical module as defined in claim 1 wherein said optical filter is movably supported so as to regulate an angle of incidence of the second laser beam component.

9. The optical module as defined in claim 1 wherein said optical filter is fixedly mounted on a filter holder and wherein a temperature sensor is fixedly disposed at a position near the filter holder.

10. The optical module as defined in claim 9 wherein said optical filter is disposed on said filter holder.

11. The optical module as defined in claim 1 wherein said optical filter is supported for rotational movement about a rotation axis perpendicular to a propagation direction of second laser beam component.

12. The optical module as defined in claim 1 wherein a collimating lens configured to collimate the monitoring laser beam outputted from the other facet of the light-emitting device is disposed between said light-emitting device and said beam splitter.

13. The optical module as defined in claim 1, further comprising:
   a temperature regulating unit configured to regulate a temperature in said light-emitting device; and
   a control unit configured to control said temperature regulating unit to perform wavelength control of the laser beam outputted from said light-emitting device, based on the first electrical signal and the second electrical signal outputted from said first photo detector and the second photo detector.

14. The optical module as defined in claim 13, further comprising:
   a correction unit configured to provide a temperature correction signal to said control unit, based on a signal from a temperature sensing unit which is located near said optical filter.

15. An optical module comprising:
   a light-emitting device configured to output a laser beam at one facet and a monitoring laser beam at another facet;
   an optical fiber configured to receive the laser beam and couple the laser beam therein;
   means for splitting the monitoring laser beam into a first laser beam component and a second laser beam component that are respectively inclined relative to an optical axis of the monitoring laser beam within a predetermined angle less than 90 degrees;
   a first means for producing a first electrical signal in response to receiving the first laser beam component;
   a second means for producing a second electrical signal in response to receiving light from the second laser beam component;
   means for permitting only a portion of said second laser beam component having a predetermined wavelength range to transmit therethrough to said second means for producing a second electrical signal; and
   means for positioning said first means for producing a first electrical signal and said second means for producing a second electrical signal respectively to receive said first laser beam component and said second laser beam component in a common plane.

16. The optical module as defined in claim 15 wherein said means for positioning includes means for mounting said first means for producing a first electrical signal and said second means for producing an electrical signal in the common plane.

17. The optical module as defined in claim 15 wherein said means for splitting includes means for dividing the monitoring laser beam into the first laser beam component and the second laser beam component which are inclined relative to the optical axis with a substantially same angle.

18. The optical module as defined in claim 15 wherein said means for splitting includes means for outputting the first laser beam component and the second laser beam component through a common surface.

19. The optical module as defined in claim 18 wherein the predetermined angle is equal to or smaller than 65 degrees.

20. The optical module as defined in claim 15 further comprising means for aligning said means for splitting, said means for permitting and said means for positioning.

21. The optical module as defined in claim 15 wherein said means for permitting includes means for regulating an angle of incidence of the second laser beam component on said means for permitting.

22. The optical module as defined in claim 15, further comprising:
   means for monitoring a temperature of said means for means for permitting.

23. The optical module as defined in claim 22 further comprising means for adjusting a lasing wavelength of said light-emitting device based on a temperature observed by said means for monitoring.

24. A method of stabilizing a laser beam wavelength in an optical module, comprising steps of:
   outputting a laser beam from one facet of a light-emitting device;
   outputting a monitoring laser beam at another facet of the light-emitting device;
   receiving in an optical fiber the laser beam and coupling the laser beam within the optical fiber;
   splitting the monitoring laser beam into a first laser beam component and a second laser beam component that are respectively inclined relative to an optical axis of the monitoring laser beam within a predetermined angle less than 90 degrees;
   receiving the first laser beam component at a first photo detector and producing a first electrical signal that corresponds with an amount of optical energy in the first laser beam component;
   optically filtering the second laser beam component so as to permit only a portion of said second laser beam component having a predetermined wavelength range to transmit therethrough;
   receiving light that is output in the optically filtering step at a second photo detector and producing a second electrical signal that corresponds with an amount of optical energy that remains in said second laser beam component after said optically filtering step;
   positioning the first photo detector and the second photo detector on a common holding member.

25. The method as defined in claim 24, wherein:
   said position step includes fixing the first photo detector and the second photo detector on the common holding member in a common plane.

26. The method as defined in claim 24 wherein said splitting step includes dividing the monitoring laser beam into the first laser beam component and the second laser beam component which are inclined relative to the optical axis with a substantially same angle.

27. The method as defined in claim 24 wherein said splitting step includes outputting the first laser beam component and the second laser beam component through a common surface.

28. The method as defined in claim 27 wherein the predetermined angle is equal to or smaller than 65 degrees.

29. The method as defined in claim 24 further comprising a step of aligning components used to perform said splitting step, said optically filtering step and said positioning step.

30. The method as defined in claim 24 wherein said permitting includes regulating an angle of incidence of the second laser beam component on an optical filter used in said optically filtering step.

31. The method as defined in claim 24, further comprising a step of:
   monitoring a temperature of said means for means for permitting.

32. The method as defined in claim 31 further comprising a step of:
   adjusting an angle of incidence of said second laser beam component on an optical filter used in said optically filtering step based on a temperature observed in said monitoring step.

* * * * *